(12) United States Patent
Choi et al.

(10) Patent No.: US 9,054,228 B2
(45) Date of Patent: Jun. 9, 2015

(54) SEMICONDUCTOR PACKAGES INCLUDING A HEAT SPREADER AND METHODS OF FORMING THE SAME

(71) Applicant: Samsung Electronics Co., Ltd., Suwon-si (KR)

(72) Inventors: Eun-Kyoung Choi, Hwaseong-si (KR); Jong-Youn Kim, Seoul (KR); Sang-Wook Park, Hwaseong-si (KR); Hae-Jung Yu, Seoul (KR); In-Young Lee, Yongin-si (KR); Sang-Uk Han, Hwaseong-si (KR); Ji-Seok Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/160,008

(22) Filed: Jan. 21, 2014

(65) Prior Publication Data
US 2014/0299980 A1  Oct. 9, 2014

(30) Foreign Application Priority Data

Apr. 5, 2013 (KR) ........................ 10-2013-0037620

(51) Int. Cl.
| | | |
|---|---|---|
| *H01L 23/02* | (2006.01) | |
| *H01L 23/34* | (2006.01) | |
| *H01L 23/00* | (2006.01) | |
| *H01L 23/36* | (2006.01) | |
| *H01L 23/373* | (2006.01) | |
| *H01L 23/433* | (2006.01) | |

(Continued)

(52) U.S. Cl.
CPC ....... *H01L 24/97* (2013.01); *H01L 2224/16225* (2013.01); *H01L 2224/32225* (2013.01); *H01L 2224/73204* (2013.01); *H01L 2924/15311* (2013.01); *H01L 23/3128* (2013.01); *H01L 23/36* (2013.01); *H01L 23/3737* (2013.01); *H01L 23/4334* (2013.01); *H01L 23/481* (2013.01); *H01L 21/561* (2013.01); *H01L 23/3114* (2013.01)

(58) Field of Classification Search
USPC .......................... 257/686, 774, 787, E23.145
See application file for complete search history.

(56) References Cited

U.S. PATENT DOCUMENTS

| 5,668,400 A | * | 9/1997 | Quinn ............................ 257/618 |
| 6,166,434 A | * | 12/2000 | Desai et al. .................... 257/704 |

(Continued)

FOREIGN PATENT DOCUMENTS

| JP | 2012-169330 | 9/2012 |
| KR | 10-2001-0068505 A | 7/2001 |

(Continued)

*Primary Examiner* — Nitin Parekh
(74) *Attorney, Agent, or Firm* — Myers Bigel Sibley & Sajovec, P.A.

(57) ABSTRACT

Semiconductor packages including a heat spreader and methods of forming the same are provided. The semiconductor packages may include a first semiconductor chip, a second semiconductor chip, and a heat spreader stacked sequentially. The semiconductor packages may also include a thermal interface material (TIM) layer surrounding the second semiconductor chip and directly contacting a sidewall of the second semiconductor chip. An upper surface of the TIM layer may directly contact a lower surface of the heat spreader, and a sidewall of the TIM layer may be substantially coplanar with a sidewall of the heat spreader. In some embodiments, a sidewall of the first semiconductor chip may be substantially coplanar with the sidewall of the TIM layer.

20 Claims, 30 Drawing Sheets

(51) Int. Cl.
*H01L 23/48* (2006.01)
*H01L 23/31* (2006.01)
*H01L 21/56* (2006.01)

(56) References Cited

U.S. PATENT DOCUMENTS

| | | | |
|---|---|---|---|
| 6,759,268 B2 * | 7/2004 | Akagawa | 438/106 |
| 7,610,678 B2 | 11/2009 | Tokuhira et al. | |
| 7,704,798 B2 | 4/2010 | Hua et al. | |
| 7,745,264 B2 * | 6/2010 | Zhai et al. | 438/127 |
| 7,964,951 B2 | 6/2011 | Refai-Ahmed | |
| 8,030,757 B2 | 10/2011 | Renavikar et al. | |
| 2002/0180035 A1 * | 12/2002 | Huang et al. | 257/706 |
| 2008/0067669 A1 | 3/2008 | Buttel | |
| 2008/0136004 A1 * | 6/2008 | Yang et al. | 257/686 |
| 2011/0233756 A1 | 9/2011 | Khandekar et al. | |
| 2011/0239459 A1 | 10/2011 | Kwon | |
| 2012/0211885 A1 * | 8/2012 | Choi et al. | 257/737 |
| 2013/0105991 A1 * | 5/2013 | Gan et al. | 257/777 |

FOREIGN PATENT DOCUMENTS

| | | |
|---|---|---|
| KR | 10-2005-0031599 A | 4/2005 |
| KR | 10-2006-0025759 A | 3/2006 |
| KR | 10-2011-0033367 A | 3/2011 |

* cited by examiner

SEMICONDUCTOR PACKAGES INCLUDING A HEAT SPREADER AND METHODS OF FORMING THE SAME

CROSS-REFERENCE TO RELATED APPLICATION

This U.S. non-provisional application claims priority under 35 U.S.C. §119 to Korean Patent Application No. 10-2013-0037620, filed on Apr. 5, 2013, in the Korean Intellectual Property Office, the disclosure of which is hereby incorporated by reference in its entirety.

FIELD

The present disclosure generally relates to the field of electronics and, more particularly, to semiconductor devices.

BACKGROUND

Due to the increased demand for lightweight, thin, and small-sized electronic systems, various packaging technologies to put a plurality of semiconductor chips and a heat spreader in a single package have been developed.

SUMMARY

A semiconductor package may include a first semiconductor chip including a plurality of through-silicon vias (TSVs), a plurality of connection terminals on a first surface of the first semiconductor chip and respectively connected to the plurality of TSVs, and a second semiconductor chip on a second surface of the first semiconductor chip. The semiconductor package may also include a thermal interface material (TIM) layer on the first semiconductor chip and in contact with side surfaces of the second semiconductor chip, and a heat spreader on the second semiconductor chip and the TIM layer. Side surfaces of the first semiconductor chip, the TIM layer, and the heat spreader may be substantially coplanar with each other.

According to various embodiments, the second semiconductor chip may have a horizontal width smaller than a horizontal width of the first semiconductor chip, and the TIM layer may cover an upper surface and the side surfaces of the second semiconductor chip.

In various embodiments, the heat spreader may be in direct contact with the second semiconductor chip.

According to various embodiments, an edge portion of the first surface of the first semiconductor chip may include a recess defined by a portion of a scribe lane, and the side surface of the first semiconductor chip may terminate at the recess. The first surface of the first semiconductor chip may extend in a first direction and the side surface of the first semiconductor chip may extend in a second direction. An angle between the first direction and the second direction may be an obtuse angle.

According to various embodiments, an edge portion of a first surface of the heat spreader may include a recess defined by a portion of a scribe lane and the side surface of the heat spreader terminates at the recess. The first surface of the heat spreader may extend in a first direction and the side surface of the heat spreader may extend in a second direction. An angle between the first direction and the second direction may be an obtuse angle.

In various embodiments, the semiconductor package may further include a substrate under the first semiconductor chip such that the first semiconductor is disposed between the second semiconductor chip and the substrate. The substrate may be connected to the plurality of connection terminals. In some embodiments, an underfill layer may be disposed between the first semiconductor chip and the substrate and the plurality of connection terminals may pass through the underfill layer and may be connected to the TSVs and the substrate. In some embodiments, an encapsulant may be disposed on the substrate and the encapsulant may cover the side surfaces of the first semiconductor chip, the TIM layer, and the heat spreader. The encapsulant may extend between the first semiconductor chip and the substrate, and the plurality of connection terminals may pass through the encapsulant and may be connected to the TSVs and the substrate.

A semiconductor package may include a package substrate, a first semiconductor chip on the package substrate, a plurality of first connection terminals between the package substrate and the first semiconductor chip, a second semiconductor chip on the first semiconductor chip and a plurality of second connection terminals between the second semiconductor chip and the first semiconductor chip. The first semiconductor chip may include a plurality of through-silicon vias (TSVs). The plurality of first connection terminals may be respectively connected to the plurality of TSVs. The plurality of second connection terminals may be respectively connected to the plurality of TSVs. The semiconductor package may also include a thermal interface material (TIM) layer on the first semiconductor chip and in contact with side surfaces of the second semiconductor chip, a heat spreader on the TIM layer, and an encapsulant on the package substrate. The encapsulant may cover side surfaces of the first semiconductor chip, the TIM layer, and the heat spreader and the side surfaces of the first semiconductor chip, the TIM layer, and the heat spreader may be substantially coplanar with each other.

In various embodiments, the encapsulant may extend between the package substrate and the first semiconductor chip. The plurality of first connection terminals may pass through the encapsulant to be connected to the package substrate.

According to various embodiments, the first semiconductor chip may include a first surface substantially perpendicular to the side surface of the first semiconductor chip, and the heat spreader may include a lower surface facing the TIM layer and an upper surface opposite the lower surface. An edge portion of the first surface of the first semiconductor chip or an edge portion of the upper surface of the heat spreader may include a recess defined by a portion of a scribe lane. The side surface of the first semiconductor chip or the side surface of the heat spreader may terminate at the recess.

In various embodiments, the first surface of the first semiconductor chip may extend in a first direction and the side surface of the first semiconductor chip may extend in a second direction. An angle between the first direction and the second direction may be an obtuse angle.

A semiconductor package may include a first semiconductor chip, a second semiconductor chip on the first semiconductor chip, an adhesive layer between the first semiconductor chip and the second semiconductor chip, and a thermal interface material (TIM) layer on the first semiconductor chip and in contact with side surfaces of the second semiconductor chip and the adhesive layer.

According to various embodiments, the adhesive layer may include an underfill layer, a die-attach film (DAF), a non-conductive film (NCF), or a combination thereof.

According to various embodiments, the semiconductor package may also include a heat spreader on the second semiconductor chip and the TIM layer. In some embodiments, the heat spreader may be in contact with the TIM layer. Side surfaces of the first semiconductor chip, the TIM layer, and the heat spreader may be substantially coplanar with each other.

A semiconductor package may include a first semiconductor chip, a second semiconductor chip on the first semiconductor chip, a heat spreader on the second semiconductor chip such that the second semiconductor chip is between the first semiconductor chip and the heat spreader, and a thermal interface material (TIM) layer surrounding the second semiconductor chip and directly contacting a sidewall of the second semiconductor chip. The first and second semiconductor chips may be electrically connected to each other. An upper surface of the TIM layer may directly contact a lower surface of the heat spreader, and a sidewall of the TIM layer may be substantially coplanar with a sidewall of the heat spreader.

According to various embodiments, the first semiconductor chip may have a first width greater than a second width of the second semiconductor chip when viewed in cross section, and a sidewall of the first semiconductor chip may be substantially coplanar with the sidewall of the TIM layer. In some embodiments, the first semiconductor chip may include a first surface facing the second semiconductor chip and a second surface opposite the first surface, and an edge portion of the second surface of the first semiconductor chip may include a recess defined by a portion of a scribe lane.

According to various embodiments, an upper surface of the second semiconductor chip may directly contact the lower surface of the heat spreader.

In some embodiments, the heat spreader may include an upper surface opposite the lower surface, and an edge portion of the upper surface of the heat spreader may include a recess defined by a portion of a scribe lane.

DETAILED DESCRIPTION

Figure 1:
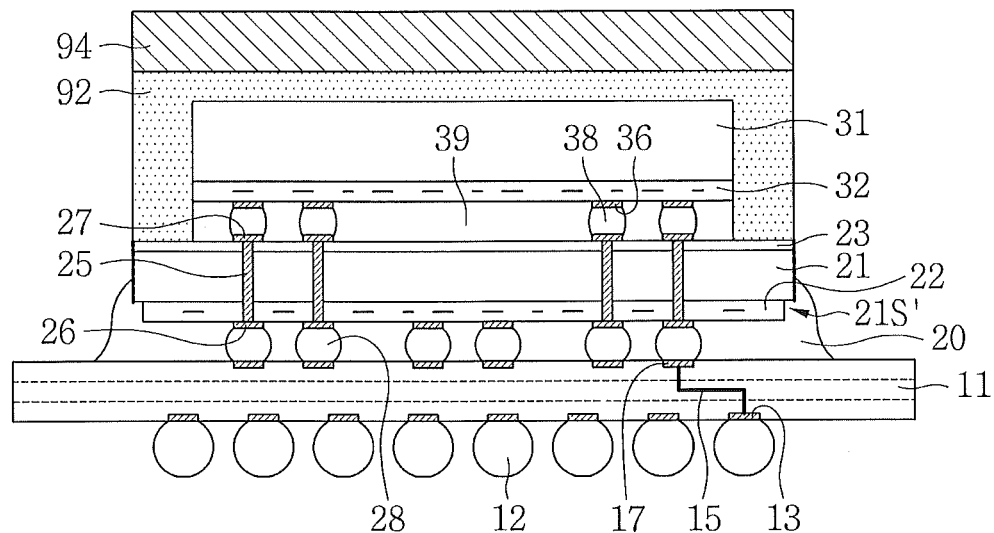
FIGS. 1 through 10 are cross-sectional views of a semiconductor package according to some embodiments of the present inventive concept.

Example embodiments are described with reference to the accompanying drawings. The present inventive concept may, however, be embodied in different forms without deviating from the spirit and teachings of this disclosure and should not be construed as limited to the example embodiments set forth herein. Rather, these example embodiments are provided so that this disclosure will be thorough and complete, and will fully convey the scope of the present inventive concept to those skilled in the art. Like reference numbers refer to like elements throughout.

Example embodiments of the present inventive concept are described herein with reference to cross-sectional views or perspective views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing. In the drawings, the thicknesses of layers and regions may be exaggerated for clarity.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, A, B, etc. may be used herein to describe to various elements, these elements should not be construed as limited by these terms. For example, a first element could be termed a second element, and a second element could be termed a first element, without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Conventional methods of forming a semiconductor package may include forming an encapsulant to cover first and second semiconductor chips sequentially staked on a substrate and removing a portion of the encapsulant on an upper surface of the second semiconductor chip to place a heat spreader on the upper surface of the second semiconductor chip. Removing the portion of the encapsulant on the upper surface of the second semiconductor chip may be performed by a grinding method and, as appreciated by the present inventive entity, this removing process may cause defects on semiconductor packages, such as chip cracks.

FIGS. 1 through 10 are cross-sectional views of a semiconductor package according to some embodiments of the present inventive concept.

Referring to FIG. 1, a first semiconductor chip 21 may be mounted on a substrate 11. A second semiconductor chip 31 may be mounted on the first semiconductor chip 21. A thermal interface material (TIM) layer 92 may be formed on the first semiconductor chip 21 may cover the second semiconductor chip 31. A heat spreader 94 may be formed on the TIM layer 92. Side surfaces of the first semiconductor chip 21, the TIM layer 92, and the heat spreader 94 may be exposed. The side surfaces of the first semiconductor chip 21, the TIM layer 92, and the heat spreader 94 may be aligned on a straight line or may be substantially coplanar with each other. That is, the side surfaces of the first semiconductor chip 21, the TIM layer 92, and the heat spreader 94 form a planar surface.

The substrate 11 may include a plurality of external electrodes 13, a plurality of substrate lines 15, and a plurality of internal electrodes 17. External terminals 12 may be formed on the external electrodes 13. The first semiconductor chip 21 may include a first active layer 22, first recesses 21S' defined by portions of a first scribe lane (such as the scribe lane 21S illustrated in, for example, FIG. 11.), a first rear surface layer 23, a plurality of first through-silicon vias 25 (TSVs), a plurality of first lower electrodes 26, and a plurality of first upper electrodes 27. A scribe lane is used as an alignment mark during manufacturing as discussed with respect to FIGS. 11 and 12 herein. A plurality of first connection terminals 28 may be formed between the internal electrodes 17 of the substrate 11 and the first lower electrodes 26 of the first semiconductor chip 21. An underfill layer 20 may be formed between the substrate 11 and the first semiconductor chip 21.

The second semiconductor chip 31 may include a second active layer 32 and a plurality of second lower electrodes 36. Second connection terminals 38 may be formed on the second lower electrodes 36. A first adhesive layer 39 may be formed between the second active layer 32 and the first rear surface layer 23. The first adhesive layer 39 may be in contact with the second active layer 32 and the first rear surface layer 23. The first upper electrodes 27, the second connection terminals 38, and the second lower electrodes 36 may penetrate the first adhesive layer 39. The second connection terminals 38 may be formed between the second lower electrodes 36 and the first upper electrodes 27. The second connection terminals 38 may be formed through the first adhesive layer 39 and in contact with the second lower electrodes 36 and the first upper electrodes 27.

The second semiconductor chip 31 may have a smaller horizontal width than a horizontal width of the first semiconductor chip 21 when viewed in cross section. The second semiconductor chip 31 may have a greater vertical thickness than a vertical thickness of the first semiconductor chip 21. The TIM layer 92 may cover a top surface and side surfaces of the second semiconductor chip 31. The TIM layer 92 may be in contact with the first rear surface layer 23 of the first semiconductor chip 21.

Figure 11:
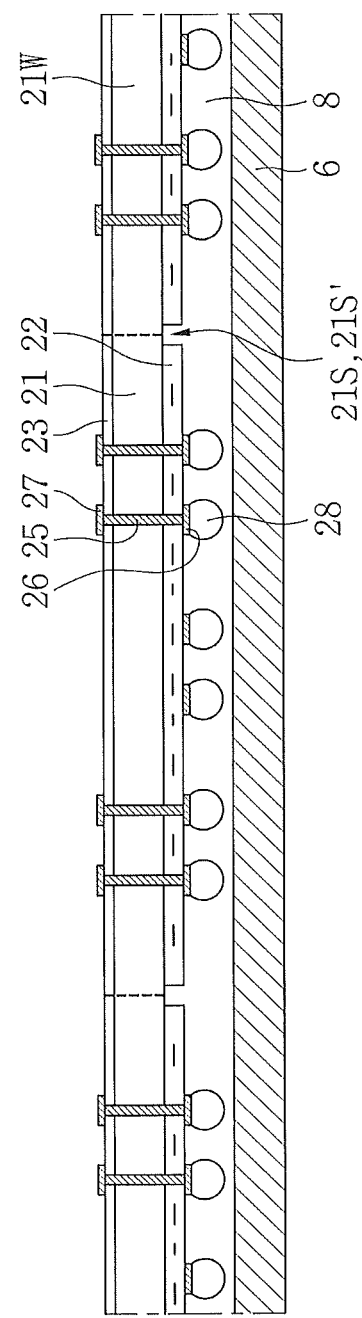
FIGS. 11, 12, 17, 18, 22, 23, and 25 are cross-sectional views illustrating an intermediate structure provided in methods of forming a semiconductor package according to some embodiments of the present inventive concept.

An edge portion of the first semiconductor chip 21 may include the first recess 21S' defined by a portion of the first scribe lane 21S (FIG. 11). The first recess 21S' may be formed on the same surface as the first active layer 22. The first recess 21S' may expose a side wall of the first active layer 22. A line passing the side surfaces of the first semiconductor chip 21, the TIM layer 92, and the heat spreader 94 may terminate at the first recess 21S'. In some embodiments, the side surface of the first semiconductor chip 21 may terminate at the first recess 21S'.

Figure 2:
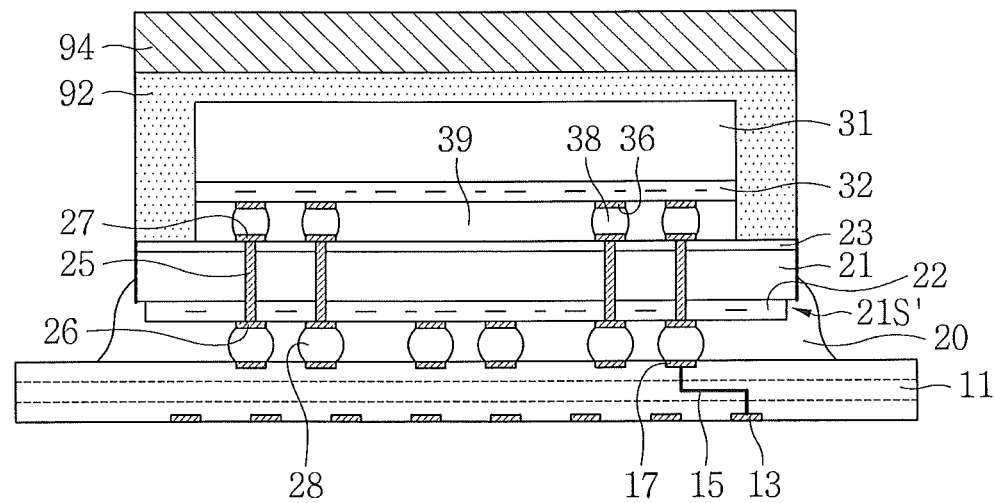

Referring to FIG. 2, the external electrodes 13 formed on one surface of the substrate 11 may be exposed. The external terminals (refer to 12 in FIG. 1) may be omitted. The external electrodes 13 may include a conductive tab, a finger electrode, a lead grid array (LGA), a pin grid array (PGA), or a combination thereof. In some embodiments, the external electrodes 13 may also be omitted.

Figure 3:
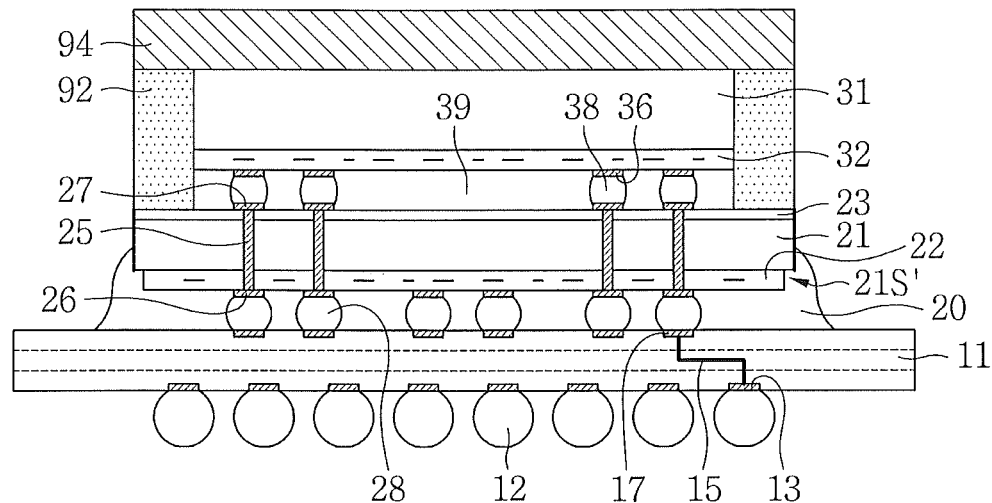

Referring to FIG. 3, the heat spreader 94 may be in direct contact with the second semiconductor chip 31 and the TIM layer 92. The TIM layer 92 may be in contact with the side surfaces of the second semiconductor chip 31.

Figure 4:
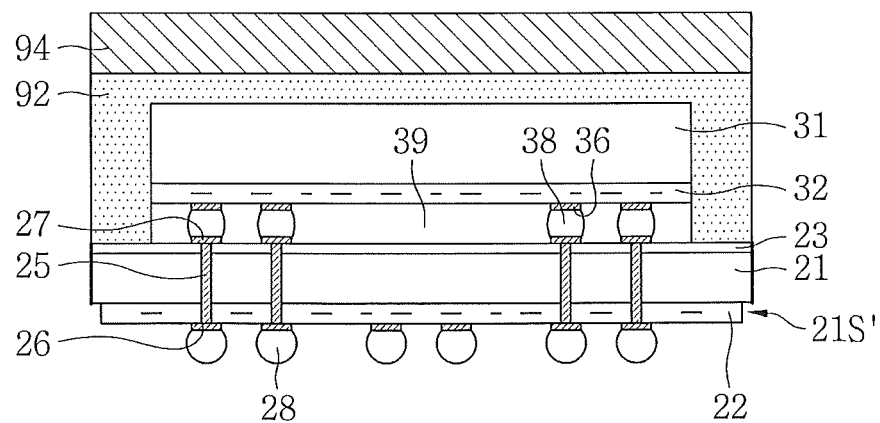

Referring to FIG. 4, the first connection terminals 28 may be exposed. The substrate 11, illustrated in FIG. 1, may be omitted. The first active layer 22 and the first recesses 21S' of the first semiconductor chip 21 may be exposed. In some embodiments, the first active layer 22 may be formed on a surface of the first semiconductor chip 21 adjacent the second semiconductor chip 31. In this case, the first rear surface layer 23 may be exposed.

Figure 5:
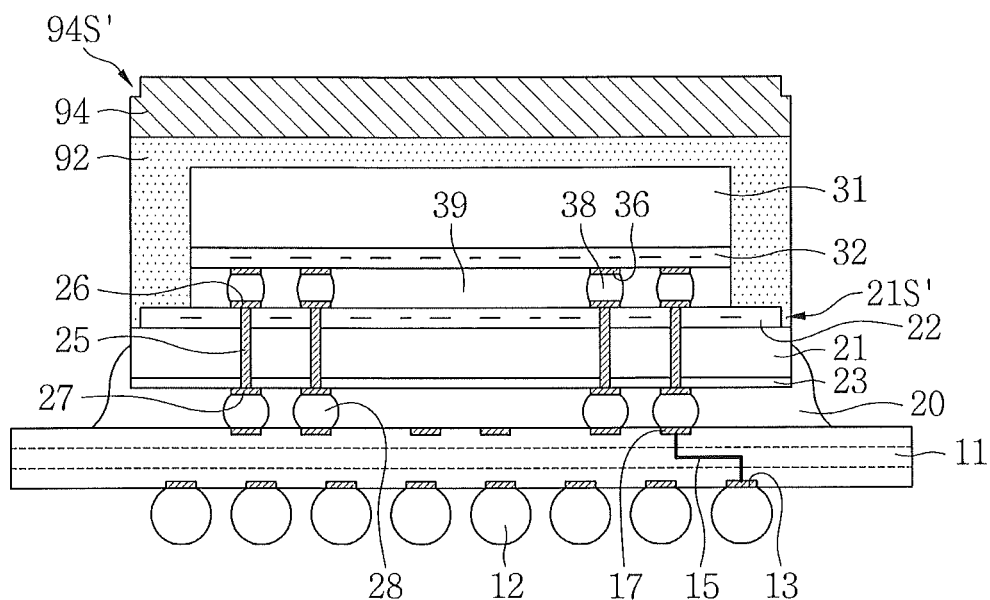

Referring to FIG. 5, the first semiconductor chip 21 may be mounted on the substrate 11. The first semiconductor chip 21 may include the first active layer 22, first recesses 21S', the first rear surface layer 23, the plurality of TSVs 25, the plurality of first lower electrodes 26, and the plurality of first upper electrodes 27. Each of the first recesses 21S' is defined by a portion of the first scribe lane 21S (FIG. 11). First connection terminals 28 may be formed between internal electrodes 17 of the substrate 11 and the first upper electrodes 27 of the first semiconductor chip 21. The first recesses 21S' and the first active layer 22 may be formed on a top surface of the first semiconductor chip 21. Each of the first recesses 21S' may be on an edge portion of the top surface of the first semiconductor chip 21.

A second semiconductor chip 31 may be mounted on the first semiconductor chip 21. A first adhesive layer 39 may be formed between the first active layer 22 of the first semiconductor chip 21 and a second active layer 32 of the second semiconductor chip 31. Second connection terminals 38 may be formed through the first adhesive layer 39 between the first lower electrodes 26 of the first semiconductor chip 21 and second lower electrodes 36 of the second semiconductor chip 31.

The TIM layer 92 may be formed on the first semiconductor chip 21 and may cover the second semiconductor chip 31. The TIM layer 92 may be in contact with the first active layer 22 of the first semiconductor chip 21. The heat spreader 94 may be formed on the TIM layer 92. A second recess 94S' defined by a portion of a second scribe lane (such as the scribe lane 94S illustrated in, for example, FIGS. 30 and 31) may be formed on a top surface of the heat spreader 94. The second recess 94S' may be formed on an edge portion of a top surface of the heat spreader 94.

Side surfaces of the first semiconductor chip 21, the TIM layer 92, and the heat spreader 94 may be exposed. The side surfaces of the first semiconductor chip 21, the TIM layer 92, and the heat spreader 94 may be substantially coplanar with each other and the side surface of the heat spreader 94 may terminate at the second recess 94S'.

Figure 6:
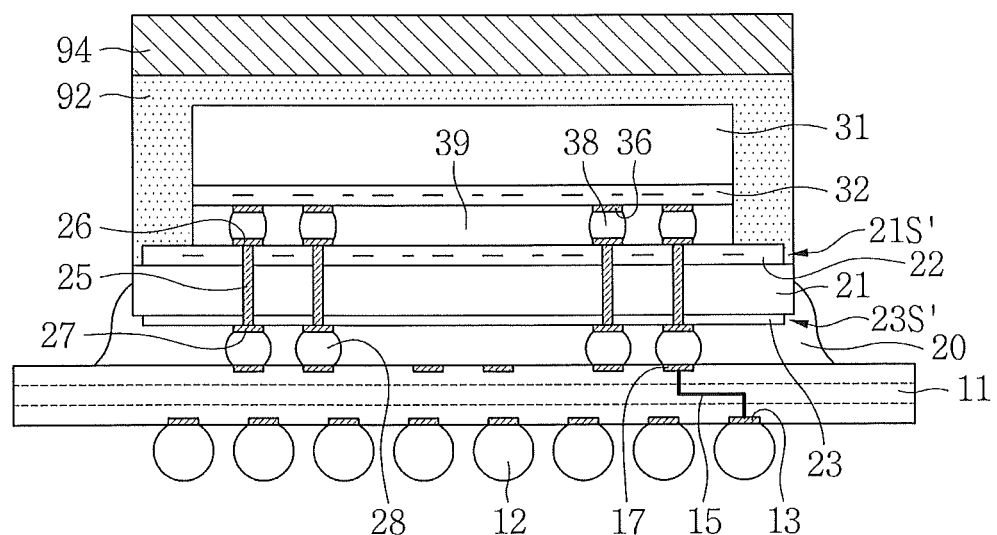

Referring to FIG. 6, the first semiconductor chip 21 may include the first active layer 22, first recesses 21S', the first rear surface layer 23, third scribe lanes 23S, the plurality of first TSVs 25, the plurality of first lower electrodes 26, and the plurality of first upper electrodes 27. Each of the first recesses 21S' is defined by a portion of the first scribe lane 21S (FIG. 11). The third scribe lanes 23S and the first rear surface layer 23 may be formed on a bottom surface of the first semiconductor chip 21. The first recesses 21S' and the first active layer 22 may be formed on the top surface of the first semiconductor chip 21. First connection terminals 28 may be formed between internal electrodes 17 of the substrate 11 and the first upper electrodes 27 of the first semiconductor chip 21.

A TIM layer 92 may be formed on the first semiconductor chip 21 and may cover a second semiconductor chip 31. The heat spreader 94 may be formed on the TIM layer 92. Side surfaces of the first semiconductor chip 21, the TIM layer 92, and the heat spreader 94 may be exposed. The side surfaces of the first semiconductor chip 21, the TIM layer 92, and the heat spreader 94 may be may be aligned on a straight line or may be substantially coplanar with each other. The side surface of the first semiconductor chip 21 may terminate at the third recess 23S' defined by a portion of a third scribe lane.

Figure 7:
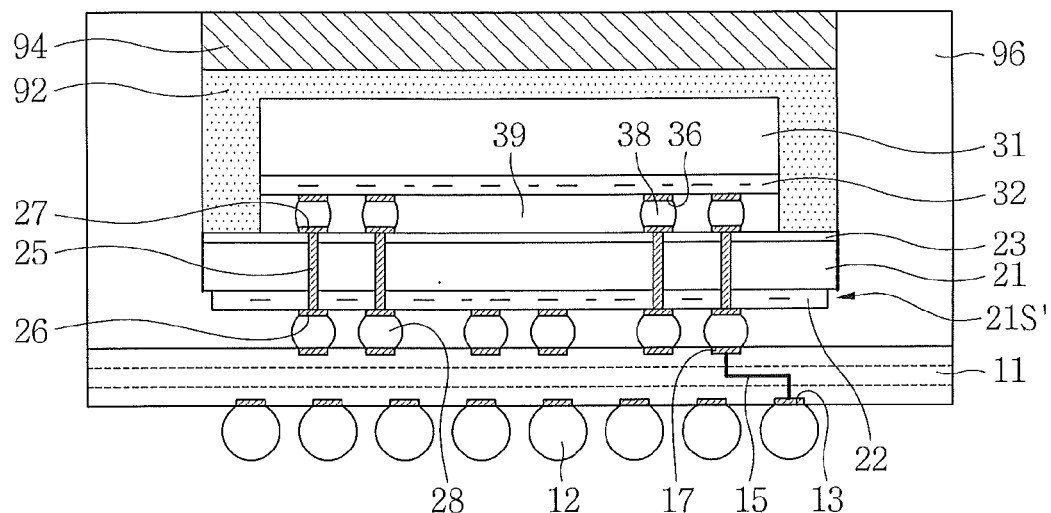

Referring to FIG. 7, the first semiconductor chip 21 may be mounted on the substrate 11. The second semiconductor chip 31 may be mounted on the first semiconductor chip 21. The TIM layer 92 may be formed on the first semiconductor chip 21 and may cover the second semiconductor chip 31. The heat spreader 94 may be formed on the TIM layer 92. The first semiconductor chip 21 may include the first active layer 22, first recesses 21S', the first rear surface layer 23, the plurality of first TSVs 25, the plurality of first lower electrodes 26, and the plurality of first upper electrodes 27. Each of the first recesses 21S' is defined by a portion of the first scribe lane 21S (FIG. 11). The encapsulant 96 may be formed on the substrate 11 and may cover side surfaces of the first semiconductor chip 21, the TIM layer 92, and the heat spreader 94. The encapsulant 96 may fill a space between the substrate 11 and the first semiconductor chip 21. The encapsulant 96 may expose a top surface of the heat spreader 94. First connection terminals 28 may be formed through the encapsulant 96 and in contact with internal electrodes 17 of the substrate 11 and the first lower electrodes 26 of the first semiconductor chip 21.

Figure 8:
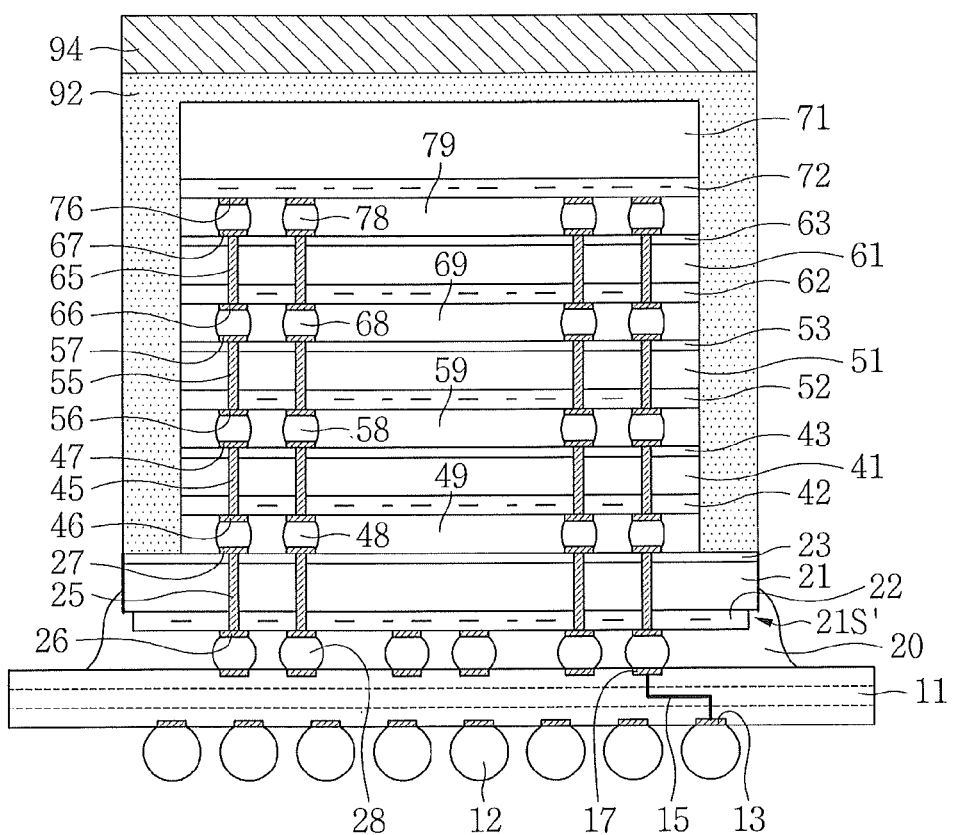

Referring to FIG. 8, the first semiconductor chip 21 may be mounted on the substrate 11. Third through sixth semiconductor chips 41, 51, 61, and 71 may be sequentially mounted on the first semiconductor chip 21. The TIM layer 92 may be formed on the first semiconductor chip 21 and may cover the third through sixth semiconductor chips 41, 51, 61, and 71. The heat spreader 94 may be formed on the TIM layer 92. The TIM layer 92 may be in contact with side surfaces of the third through sixth semiconductor chips 41, 51, 61, and 71. Side surfaces of the heat spreader 94, the TIM layer 92, and the first semiconductor chip 21 may be exposed.

The substrate 11 may include the plurality of external electrodes 13, the plurality of substrate lines 15, and the plurality of internal electrodes 17. The first semiconductor chip 21 may include the first active layer 22, first recesses 21S', the first rear surface layer 23, the plurality of first TSVs 25, the plurality of first lower electrodes 26, and the plurality of first upper electrodes 27. Each of the first recesses 21S' is defined by a portion of the first scribe lane 21S (FIG. 11). The plurality of first connection terminals 28 may be formed between the internal electrodes 17 of the substrate 11 and the first lower electrodes 26 of the first semiconductor chip 21. The underfill layer 20 may be formed between the substrate 11 and the first semiconductor chip 21.

The third semiconductor chip 41 may include a third active layer 42, a third rear surface layer 43, a plurality of third TSVs 45, a plurality of third lower electrodes 46, and a plurality of third upper electrodes 47. Third connection terminals 48 may be formed on the third lower electrodes 46. A third adhesive layer 49 may be formed between the third active layer 42 and the first rear surface layer 23. The third adhesive layer 49 may be in contact with the third active layer 42 and the first rear surface layer 23. The first upper electrodes 27, the third connection terminals 48, and the third lower electrodes 46 may penetrate the third adhesive layer 49. The third connection terminals 48 may be formed through the third adhesive layer 49 and in contact with the third lower electrodes 46 and the first upper electrodes 27.

The fourth semiconductor chip 51 may include a fourth active layer 52, a fourth rear surface layer 53, a plurality of fourth TSVs 55, a plurality of fourth lower electrodes 56, and a plurality of fourth upper electrodes 57. Fourth connection terminals 58 may be formed on the fourth lower electrodes 56. A fourth adhesive layer 59 may be formed between the fourth active layer 52 and the third rear surface layer 43. The fourth adhesive layer 59 may be in contact with the fourth active layer 52 and the third rear surface layer 43. The fourth adhesive layer 59 may be in contact with the fourth active layer 52 and the third rear surface layer 43. The third upper electrodes 47, the fourth connection terminals 58, and the fourth lower electrodes 56 may penetrate the fourth adhesive layer 59. The fourth connection terminals 58 may be formed through the fourth adhesive layer 59 and in contact with the fourth lower electrodes 56 and the third upper electrodes 47.

The fifth semiconductor chip 61 may include a fifth active layer 62, a fifth rear surface layer 63, a plurality of fifth TSVs 65, a plurality of fifth lower electrodes 66, and a plurality of fifth upper electrodes 67. Fifth connection terminals 68 may be formed on the fifth lower electrodes 66. A fifth adhesive layer 69 may be formed between the fifth active layer 62 and the fourth rear surface layer 53. The fifth adhesive layer 69 may be in contact with the fifth active layer 62 and the fourth rear surface layer 53. The fourth upper electrodes 57, the fifth connection terminals 68, and the fifth lower electrodes 66 may penetrate the fifth adhesive layer 69. The fifth connection terminals 68 may be formed through the fifth adhesive layer 69 and in contact with the fifth lower electrodes 66 and the fourth upper electrodes 57.

The sixth semiconductor chip 71 may include a sixth active layer 72 and a plurality of sixth lower electrodes 76. Sixth connection terminals 78 may be formed on the sixth lower electrodes 76. A sixth adhesive layer 79 may be formed between the sixth active layer 72 and the fifth rear surface layer 63. The sixth adhesive layer 79 may be in contact with the sixth active layer 72 and the fifth rear surface layer 63. The fifth upper electrodes 67, the sixth connection terminals 78, and the sixth lower electrodes 76 may penetrate the sixth adhesive layer 79. The sixth connection terminals 78 may be formed through the sixth adhesive layer 79 and may be in contact with the sixth lower electrodes 76 and the fifth upper electrodes 67. The third semiconductor chip 41 may have a smaller horizontal width than a horizontal width of the first semiconductor chip 21. Each of the fourth through sixth semiconductor chip 51, 61, and 71 may have substantially the same horizontal width as the horizontal width of the third semiconductor chip 41.

Figure 9:
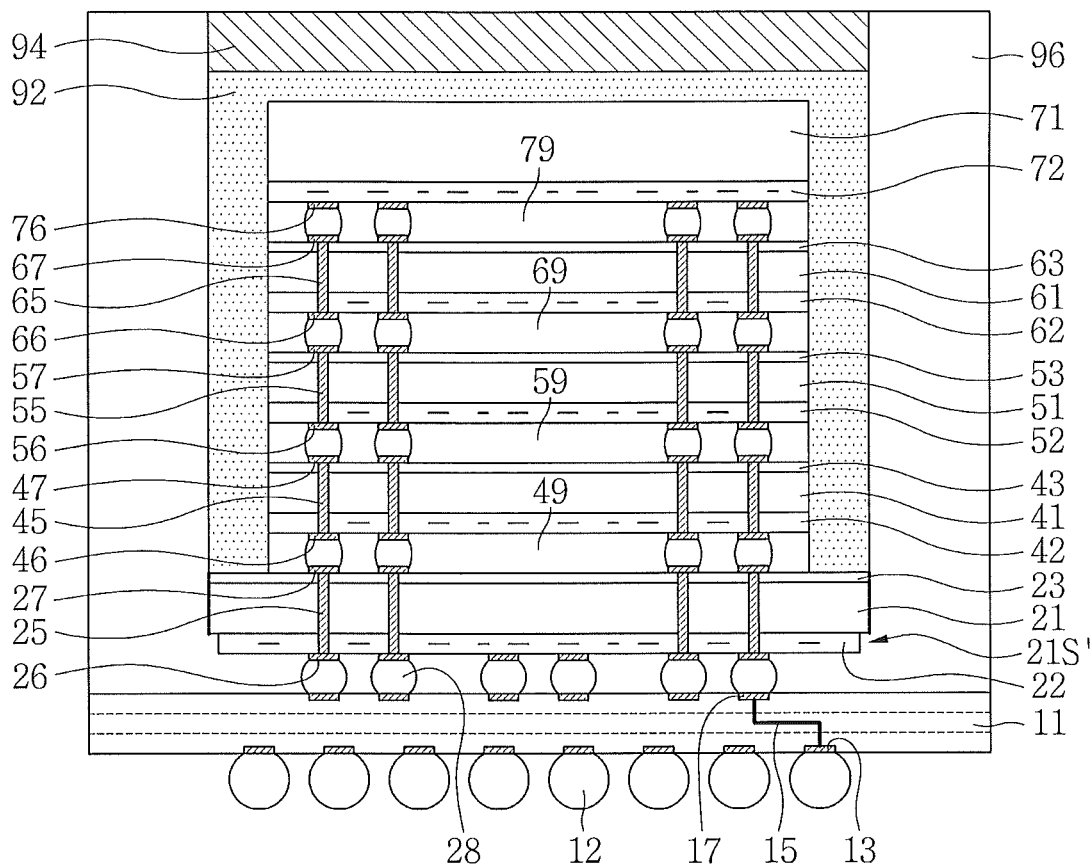

Referring to FIG. 9, the first semiconductor chip 21 may be mounted on the substrate 11. The third through sixth semiconductor chips 41, 51, 61, and 71 may be sequentially mounted on the first semiconductor chip 21. The TIM layer 92 may be formed on the first semiconductor chip 21 and may cover the third through sixth semiconductor chips 41, 51, 61, and 71. The heat spreader 94 may be formed on the TIM layer 92. The TIM layer 92 may be in contact with side surfaces of the third through sixth semiconductor chips 41, 51, 61, and 71. Side surfaces of the heat spreader 94, the TIM layer 92, and the first semiconductor chip 21 may be aligned on a straight line or may be substantially coplanar with each other. The encapsulant 96 may be formed on the substrate 11 and may cover the side surfaces of the heat spreader 94, the TIM layer 92, and the first semiconductor chip 21. The encapsulant 96 may extend between the substrate 11 and the first semiconductor chip 21. The first connection terminals 28 may be formed between internal the electrodes 17 of the substrate 11 and the first lower electrodes 26 of the first semiconductor chip 21, and may penetrate the encapsulant 96.

Figure 10:
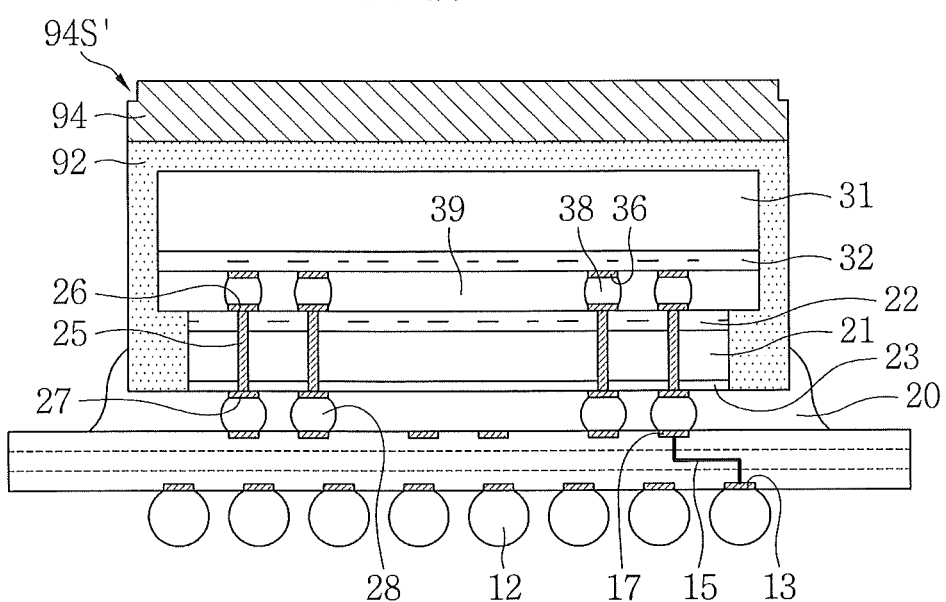

Referring to FIG. 10, the first semiconductor chip 21 may be mounted on the substrate 11. The second semiconductor chip 31 may be mounted on the first semiconductor chip 21. The second semiconductor chip 31 may have a greater horizontal width than the width of the first semiconductor chip 21. The TIM layer 92 may be formed to cover side surfaces of the first semiconductor chip 21 and may cover side and top surfaces of the second semiconductor chip 31. The heat spreader 94 may be formed on the TIM layer 92. The underfill layer 20 may be formed between the substrate 11 and the first semiconductor chip 21. The underfill layer 20 may partially cover side surfaces of the TIM layer 92. The first connection terminals 28 may be formed between the internal electrodes 17 of the substrate 11 and first upper electrodes 27 of the first semiconductor chip 21 and may penetrate the underfill layer 20.

The second recess 94S' may be formed on a top surface of the heat spreader 94. In some embodiments, the second recess 94S' may be formed on an edge portion of a top surface of the heat spreader 94. The second recess 94S' is defined by a portion of the second scribe lane 94S (FIGS. 30 and 31) remained on an edge portion of the heat spreader 94. The side surfaces of the TIM layer 92 and the heat spreader 94 may be exposed. The side surfaces of the TIM layer 92 and the heat spreader 94 may be substantially coplanar with each other and may terminate at the second recess 94S'.

FIGS. 11, 12, 17, 18, 22, 23, and 25 are cross-sectional views illustrating an intermediate structure provided in methods of forming a semiconductor package according to some embodiments of the present inventive concept.

Referring to FIG. 11, a semiconductor wafer 21W may be mounted on a carrier 6 using a sacrificial adhesive layer 8. The semiconductor wafer 21W may include a plurality of first semiconductor chips 21. Each of the first semiconductor chips 21 may include the first active layer 22, the first recesses 21S', the first rear surface layer 23, the plurality of first TSVs 25, the plurality of first lower electrodes 26, and the plurality of first upper electrodes 27. Each of the first recesses 21S' is defined by a portion of the first scribe lane 21S (FIG. 11). The first connection terminals 28 may be formed on the first lower electrodes 26.

The carrier 6 may have a greater horizontal width than a horizontal width of the semiconductor wafer 21W. The carrier 6 may include a metal, glass, silicon, engineering plastic, ceramic, or a combination thereof. The sacrificial adhesive layer 8 may be formed between the carrier 6 and the semiconductor wafer 21W. The sacrificial adhesive layer 8 may be in contact with the first active layer 22 and the first connection terminals 28. The first connection terminals 28 may include solder balls, conductive bumps, a conductive paste, or a combination thereof. For example, each of the first connection terminals 28 may be a micro-bump. The first connection terminals 28 may penetrate the sacrificial adhesive layer 8. The carrier 6 and the sacrificial adhesive layer 8 may reduce damage to the semiconductor wafer 21W and the first connection terminals 28.

Each of the first semiconductor chips 21 may be a logic chip, such as a microprocessor (MP), a controller, an application processor (AP), or a combination thereof. The first active layer 22 formed on one surface of the first semiconductor chip 21 may include various kinds of active elements, passive elements, a redistribution layer, and insulating layers. The first rear surface layer 23 formed on the other surface of the first semiconductor chip 21 may include at least one insulating layer. The first rear surface layer 23 may include a redistribution layer. Each of the first semiconductor chip 21 may include at least one of the first TSVs 25. The first lower electrodes 26 may be formed on the first active layer 22. Some of the first lower electrodes 26 may be connected to the first TSVs 25. Some of the first lower electrodes 26 may be connected to active elements or passive elements of the first active layer 22. The first upper electrodes 27 may be formed on the first rear surface layer 23 and may be connected to the first TSVs 25. Top portions of the first upper electrodes 27 may protrude from an upper surface of the first rear surface layer 23 such that upper surfaces of the first upper electrodes 27 may be higher than the upper surface of the first rear surface layer 23. Each of the first TSVs 25, the first lower electrodes 26, and the first upper electrodes 27 may include copper (Cu), titanium (Ti), titanium nitride (TiN), tantalum (Ta), tantalum nitride (TaN), tungsten (W), tungsten nitride (WN), nickel (Ni), gold (Au), silver (Ag), platinum (Pt), ruthenium (Ru), or a combination thereof. Each side surfaces of the first TSVs 25 may be surrounded with an insulating structure, such as an insulating spacer.

The first scribe lanes 21S may be formed on edges of the respective first semiconductor chips 21. Each of the first scribe lanes 21S may be disposed between two of the plurality of first semiconductor chips 21. The first scribe lanes 21S and the first active layer 22 may be formed on the same surface of the semiconductor wafer 21W. Each of the first scribe lanes 21S may expose a side surface of the first active layer 22.

In some embodiments, the first lower electrodes 26 may be formed in the first active layer 22. One or all of the first lower electrodes 26 and the first upper electrodes 27 may be omitted.

Figure 12:
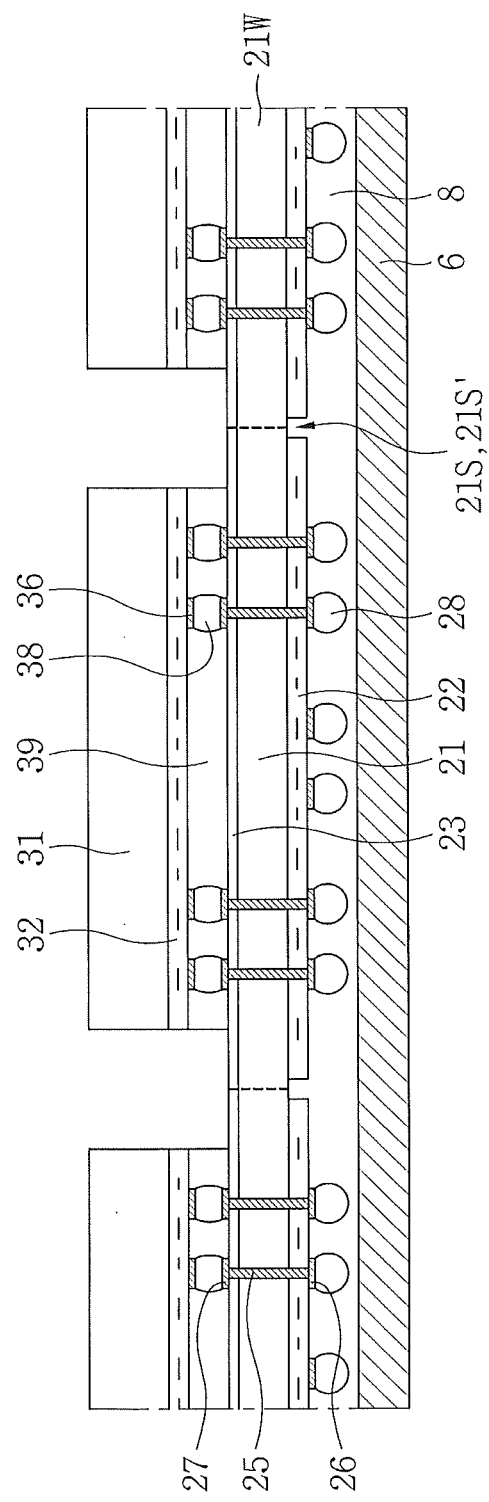

Referring to FIG. 12, the second semiconductor chips 31 may be respectively mounted on the first semiconductor chips 21. Each of the second semiconductor chips 31 may include the second active layer 32 and the plurality of second lower electrodes 36. The first adhesive layer 39 may be formed between the first rear surface layer 23 and the second active layer 32. The second connection terminals 38 may be formed between the first upper electrodes 27 and the second lower electrodes 36 and may penetrate the first adhesive layer 39.

The second active layer 32 formed on one surfaces of the second semiconductor chips 31 may include various kinds of active elements, passive elements, a redistribution layer, and insulating layers. The second lower electrodes 36 may be formed on the second active layer 32. The second lower electrodes 36 may be connected to the active elements and passive elements of the second active layer 32. Each of the second lower electrodes 36 may include Cu, Ti, TiN, Ta, TaN, W, WN, Ni, Au, Ag, Pt, Ru, or a combination thereof. Each of the second connection terminals 38 may include a solder ball, a conductive bump, conductive paste, or a combination thereof. Each of the second semiconductor chips 31 may be of a different kind from the first semiconductor chip 21. For example, each of the second semiconductor chips 31 may be a memory chip, such as a volatile memory chip or a non-volatile memory chip. In some embodiments, each of the second semiconductor chips 31 may include a mobile dynamic random access memory (DRAM). Each of the second semiconductor chips 31 may have a different horizontal width and/or vertical thickness from the horizontal width and the vertical thickness of the first semiconductor chip 21. For example, each of the second semiconductor chips 31 may have a smaller horizontal width than the horizontal width of the first semiconductor chip 21.

The first adhesive layer 39 may include a tape-type material layer, a liquid coating curing material layer, or a combination thereof. The first adhesive layer 39 may include a thermal setting structure, a thermal plastic, an ultraviolet (UV) cure material, or a combination thereof. The first adhesive layer 39 may include an epoxy-type curing agent, a silicone-type curing agent, a phenol-type curing agent, an acid anhydride-type curing agent, an amine-type curing agent, an acrylic polymer, or a combination thereof. The first adhesive layer 39 may be referred to as a die-attach film (DAF) or a non-conductive film (NCF). In some embodiments, the first adhesive layer 39 may include an underfill material.

Figure 13:
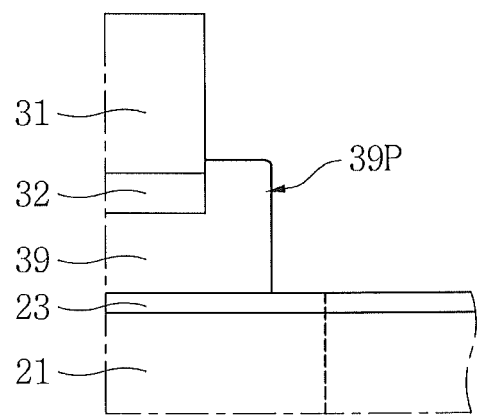
FIGS. 13 through 16 are enlarged views of a portion of the semiconductor package illustrated in FIG. 12.

FIGS. 13 through 16 are enlarged views of a portion of the semiconductor package illustrated in FIG. 12. Referring to FIG. 13, the first adhesive layer 39 may have a greater horizontal width than the horizontal width of the second semiconductor chip 31. The first adhesive layer 39 may include a protrusion 39P protruding from a sidewall of the second semiconductor chip 31. The protrusion 39P of the first adhesive layer 39 may be in contact with the sidewall of the second semiconductor chip 31. The protrusion 39P of the first adhesive layer 39 may contact a portion of the sidewall of the second active layer 32.

Figure 14:
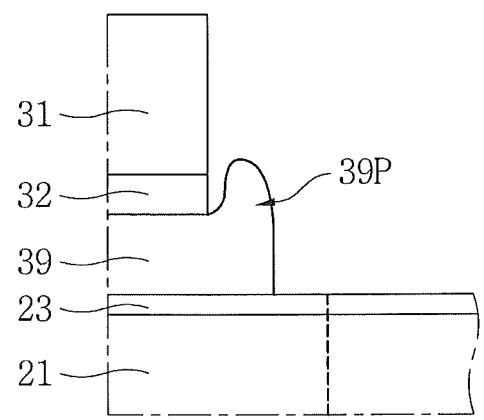

Referring to FIG. 14, the protrusion 39P of the first adhesive layer 39 may be spaced apart from the side surfaces of the second semiconductor chip 31. The protrusion 39P of the first adhesive layer 39 may also be spaced apart from the sidewall of the second active layer 32. An uppermost portion of the protrusion 39P of the first adhesive layer 39 may be higher than a top surface of the second active layer 32.

Figure 15:
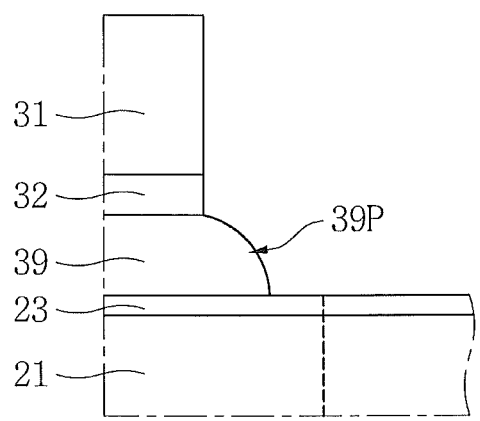

Referring to FIG. 15, the protrusion 39P of the first adhesive layer 39 may protrude from the sidewall of the second semiconductor chip 31. An uppermost portion of the protrusion 39P of the first adhesive layer 39 may be lower than a bottom surface of the second active layer 32.

Figure 16:
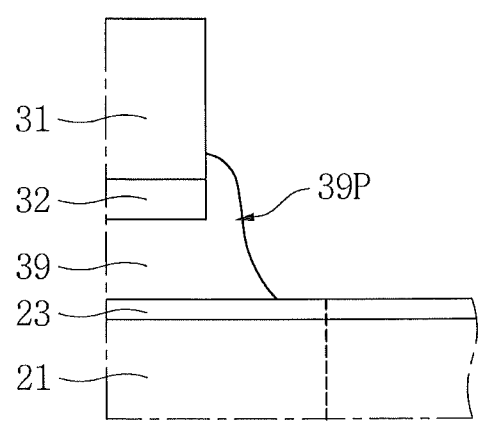

Referring to FIG. 16, the first adhesive layer 39 may include an underfill material. The first adhesive layer 39 may include the protrusion 39P, which may cover a portion of the sidewall of the second semiconductor chip 31 and may protrude from the sidewall of the second semiconductor chip 31.

Figure 17:
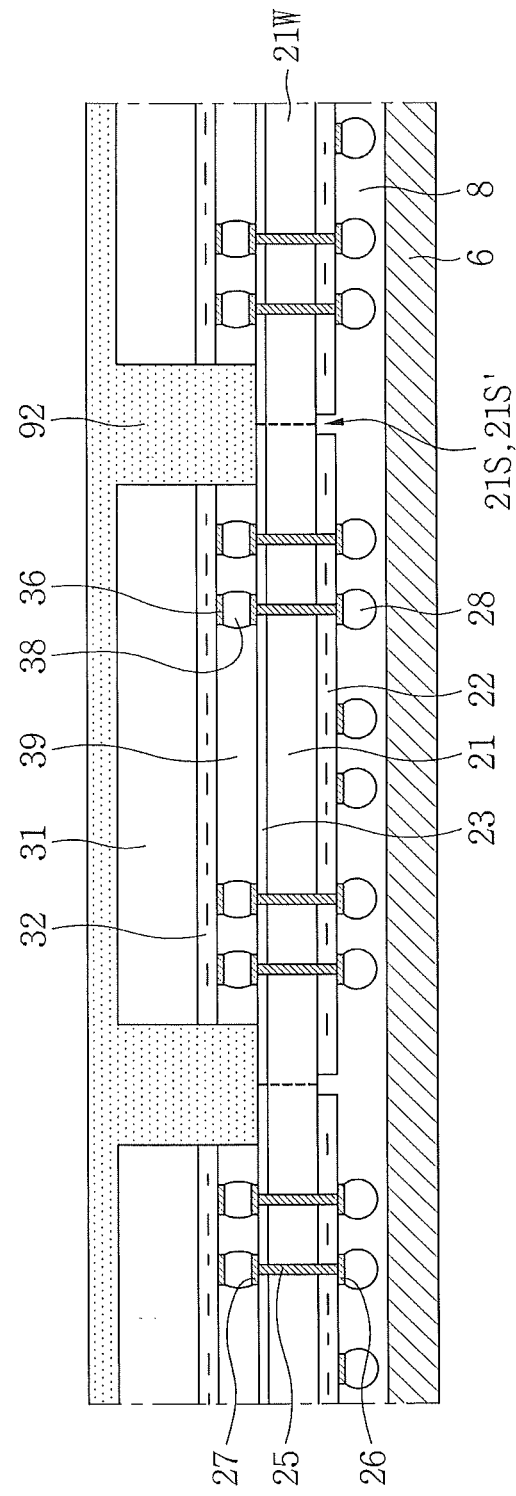

Referring to FIG. 17, the TIM layer 92 may be formed on the semiconductor wafer 21W and may cover the second semiconductor chips 31. The TIM layer 92 may fill spaces between the second semiconductor chips 31 and may contact top surfaces of the second semiconductor chips 31. The TIM layer 92 may be in contact with the first rear surface layers 23 of the first semiconductor chips 21. The TIM layer 92 may include aluminum oxide (AlO), zinc oxide (ZnO), curing resin, or a combination thereof.

In some embodiments, the TIM layer 92 may be formed between the second semiconductor chips 31. The side surfaces of the second semiconductor chips 31 may be in contact with the TIM layer 92. The TIM layer 92 may expose the top surfaces of the second semiconductor chips 31.

Figure 18:
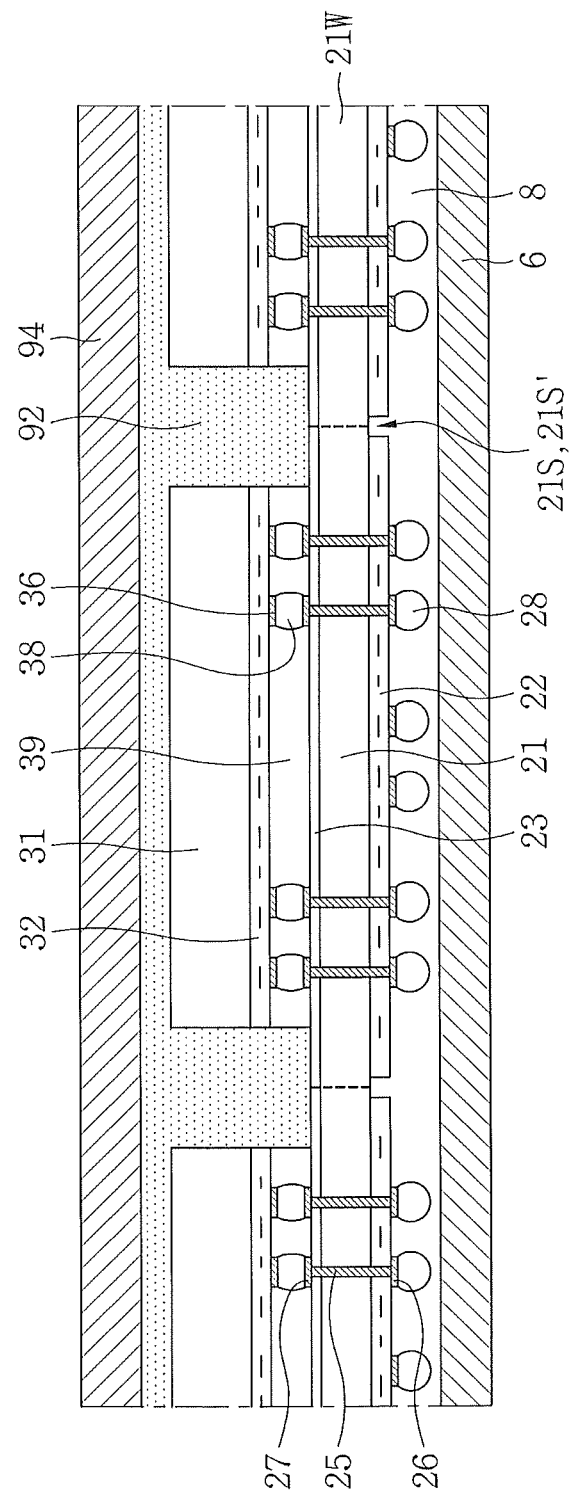

Referring to FIG. 18, the heat spreader 94 may be formed on the TIM layer 92. The heat spreader 94 may be in contact with the TIM layer 92. The heat spreader 94 may include a material having good heat transmission characteristics or high mechanical strength, for example, Cu, Al, W, TiN, TaN, Ni, or a combination thereof. For instance, the heat spreader 94 may include a metal plate. In some embodiments, the heat spreader 94 may be in contact with the TIM layer 92 and the second semiconductor chips 31.

Figure 19:
FIG. 19 is a cross-sectional view of a heat spreader according to some embodiments of the present inventive concept.

FIG. 19 is a cross-sectional view of a heat spreader according to some embodiments of the present inventive concept. Referring to FIG. 19, recessed portions may be formed on a top surface of the heat spreader 94A to increase a surface area.

Figure 20:
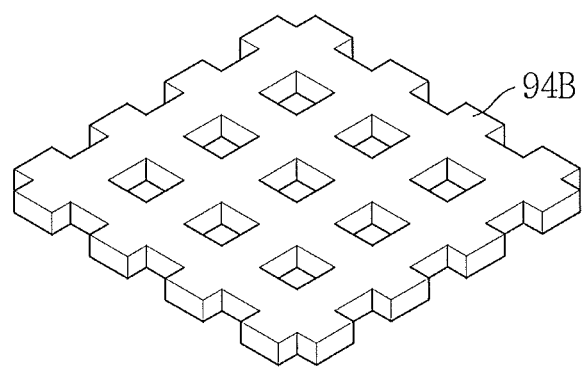
FIGS. 20 and 21 are perspective views of a heat spreader according to some embodiments of the present inventive concept.
Figure 21:
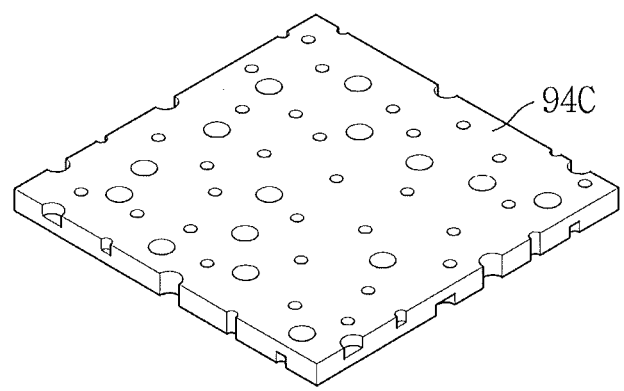

FIGS. 20 and 21 are perspective views of a heat spreader according to some embodiments of the present inventive concept. Referring to FIG. 20, a heat spreader 94B may include a structure having a lattice shape or a net shape. Referring to FIG. 21, a heat spreader 94C may include a porous material layer.

Figure 22:
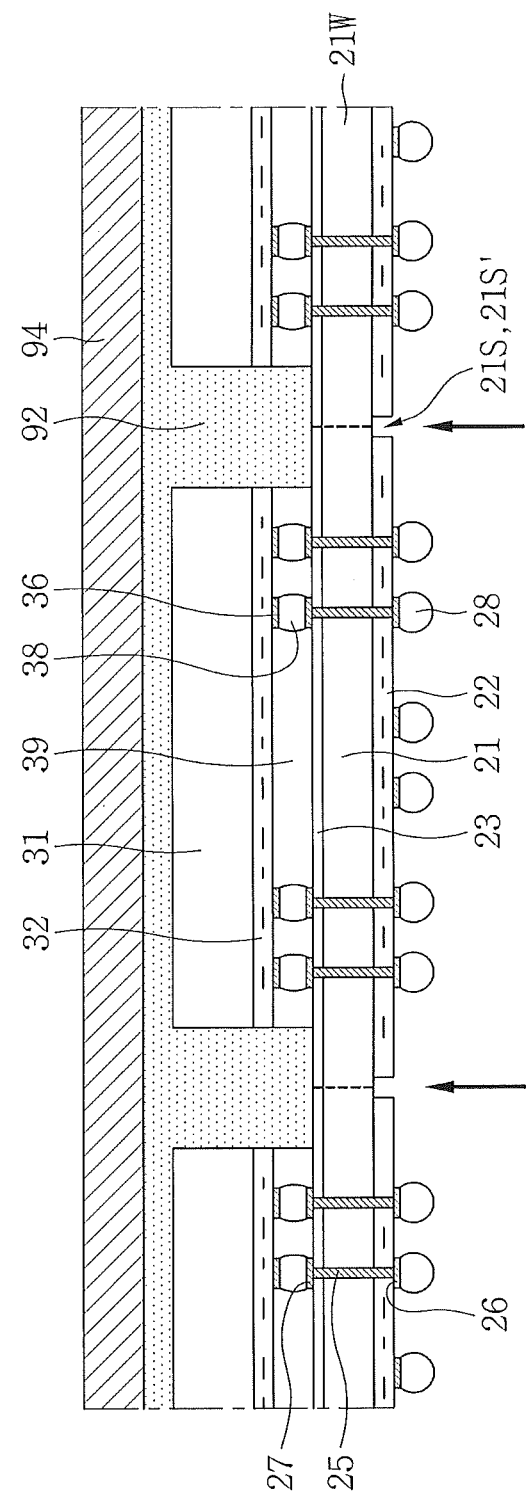
Figure 23:
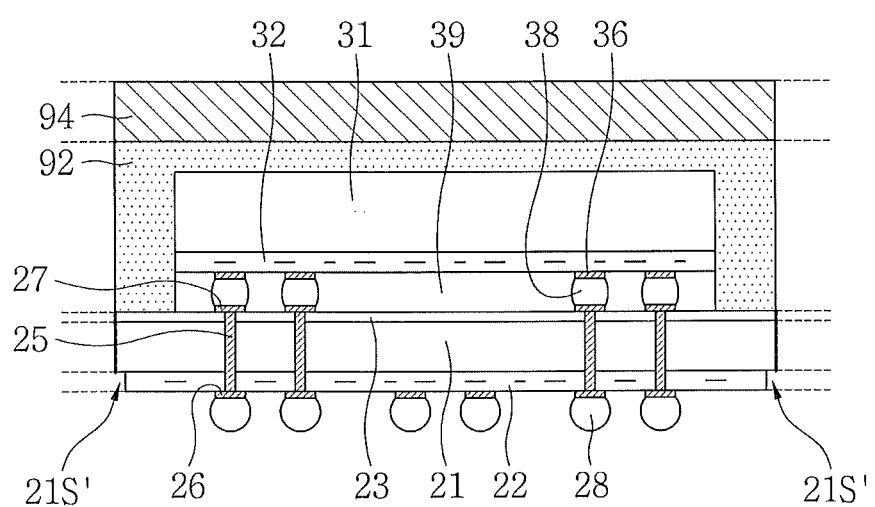
Figure 24:
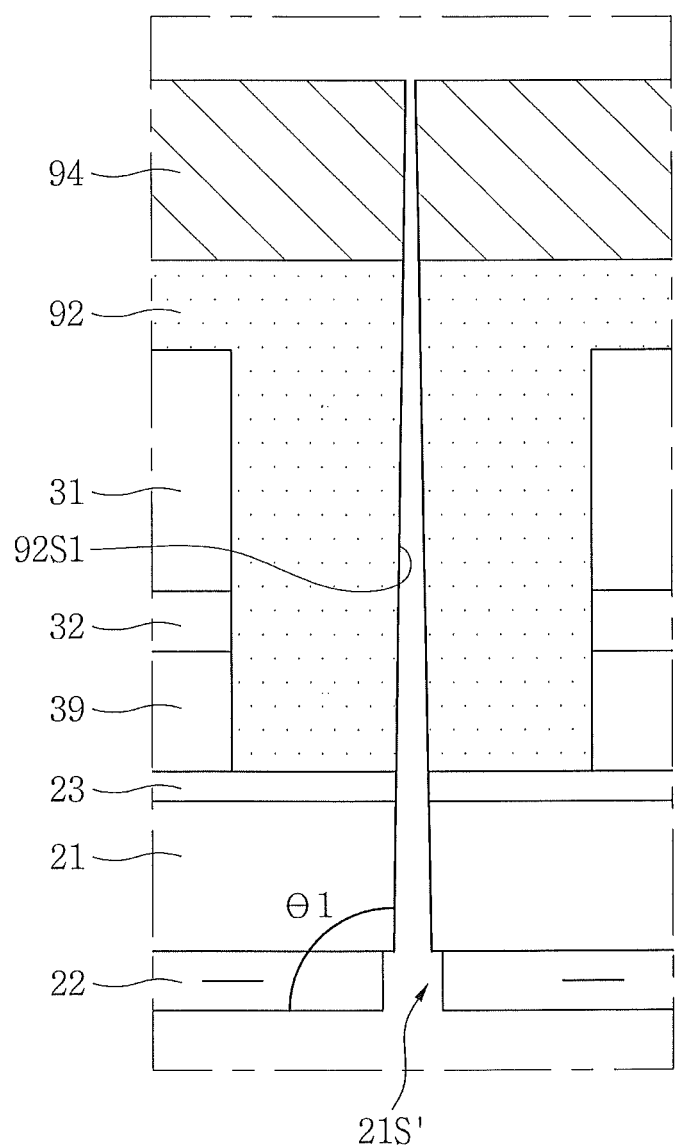
FIG. 24 is an enlarged view of a portion of the semiconductor package illustrated in FIG. 23.

Referring to FIGS. 22 through 24, the carrier 6 and the sacrificial adhesive layer 8 may be removed. The first active layer 22 and the first connection terminals 28 may be exposed. The semiconductor wafer 21W, the TIM layer 92, and the heat spreader 94 may be cut along the first scribe lanes 21S using a trimming process or a sawing process. Portions of the first scribe lanes 21S may remain on respective edges of the first semiconductor chip 21 and may define first recesses 21S'. Side surfaces of the first semiconductor chip 21, the TIM layer 92, and the heat spreader 94 may be exposed. The side surfaces of the first semiconductor chip 21, the TIM layer 92, and the heat spreader 94 may be aligned on a straight line or may be substantially coplanar with each other.

FIG. 24 is an enlarged view of a portion of the semiconductor package illustrated in FIG. 23. Referring to FIG. 24, a first straight line 92S1 defined by the side surfaces of the first semiconductor chip 21, the TIM layer 92, and the heat spreader 94 may be inclined due to a cutting technique of a sawing process. An angle between a lower surface of the first active layer 22 and the first straight line 92S1 may be a first angle $\theta 1$. The first angle $\theta 1$ may be an obtuse angle.

Figure 25:
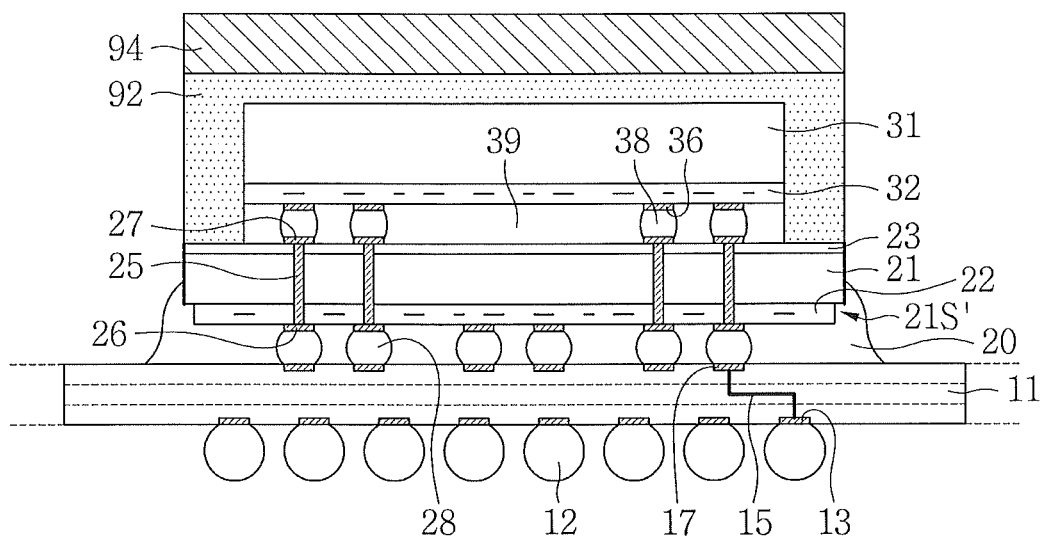

Referring to FIG. 25, the first semiconductor chip 21 may be mounted on the substrate 11. The substrate 11 may include the plurality of external electrodes 13, the plurality of substrate lines 15, and the plurality of internal electrodes 17. The first connection terminals 28 may be in contact with the internal electrodes 17 of the substrate 11. The underfill layer 20 may be formed between the substrate 11 and the first semiconductor chip 21. The external terminals 12 may be formed on the external electrodes 13.

The substrate 11 may include a rigid printed circuit board (rigid PCB), a flexible PCB, or a combination thereof. The substrate 11 may be referred to as a package substrate. The external electrodes 13 may be exposed on a bottom surface of the substrate 11. The internal electrodes 17 may be formed on a top surface of the substrate 11. The internal electrodes 17 may be connected to the external electrodes 13 via the substrate lines 15. The internal electrodes 17 may be referred to as finger electrodes or substrate pads. Each of the external electrodes 13, the substrate lines 15, and the internal electrodes 17 may include Cu, Ti, TiN, Ta, TaN, W, WN, Ni, Au, Ag, Pt, Ru, or a combination thereof. The underfill layer 20 may fill spaces between the substrate 11 and the first semiconductor chip 21 and may partially cover side surfaces of the first semiconductor chip 21. The underfill layer 20 may be in contact with the first active layer 22 and the side surfaces of the first semiconductor chip 21. Each of the external terminals 12 may include a solder ball, a conductive bump, conductive paste, a lead grid array (LGA), a pin grid array (PGA), or a combination thereof.

Figure 26:
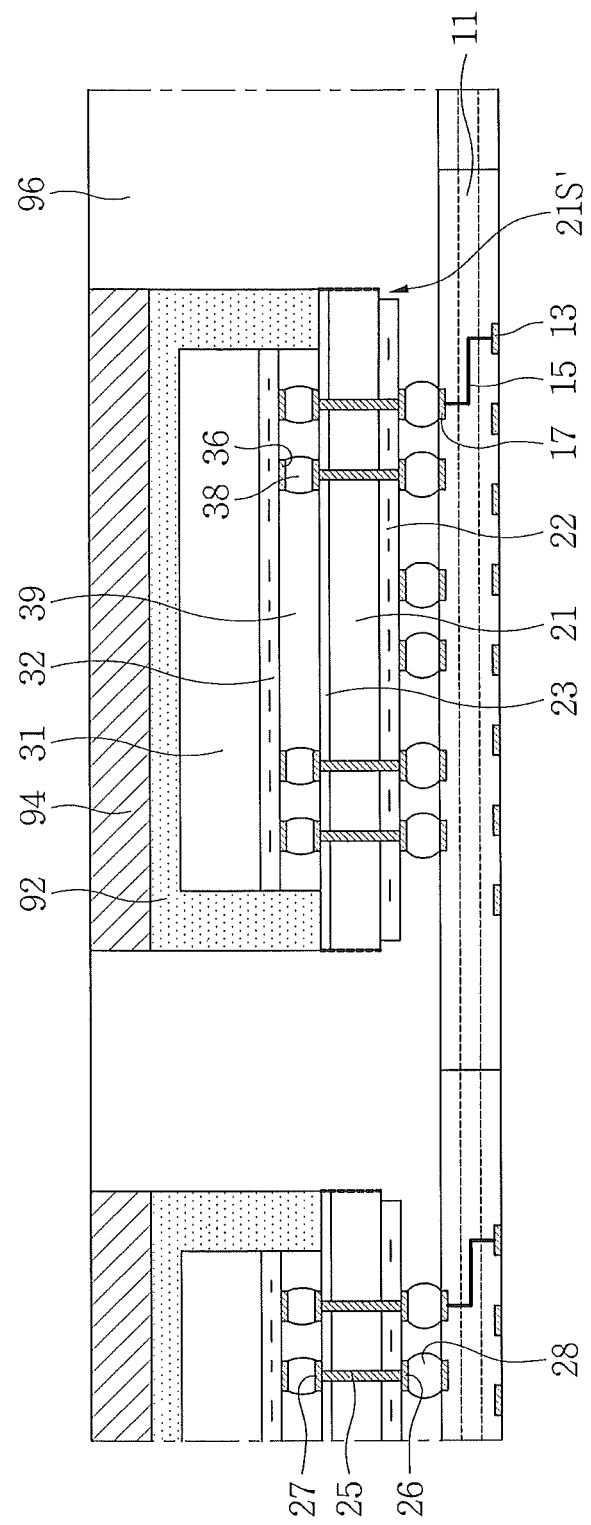
FIGS. 26 and 27 are cross-sectional views illustrating an intermediate structure provided in methods of forming a semiconductor packages according to some embodiments of the present inventive concept.
Figure 27:
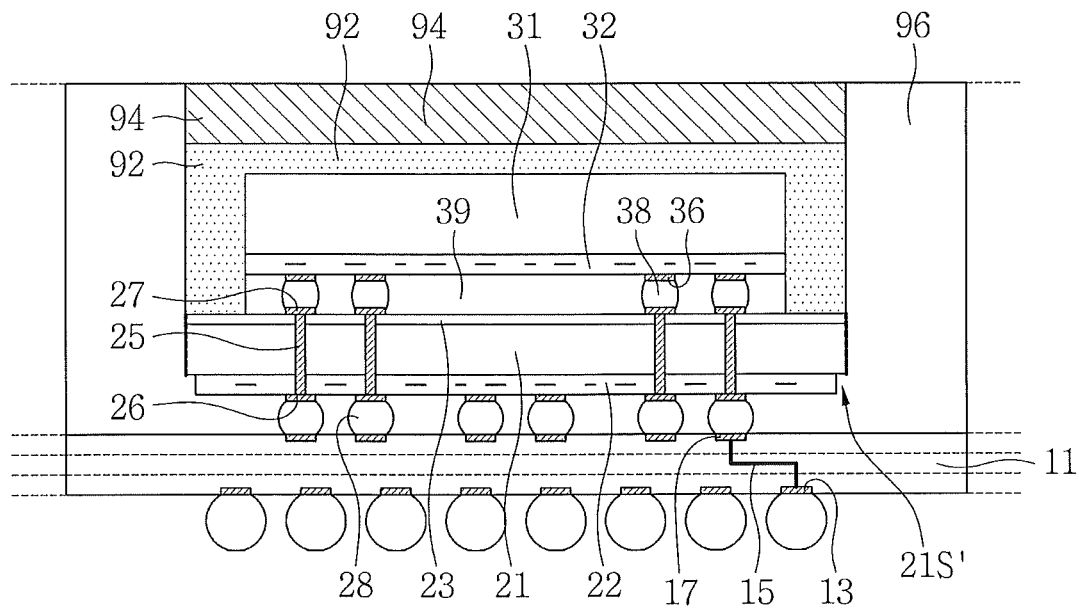
Figure 28:
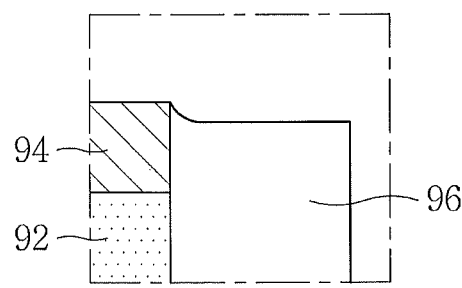
FIGS. 28 and 29 are enlarged views of a portion of the semiconductor package illustrated in FIG. 27.
Figure 29:
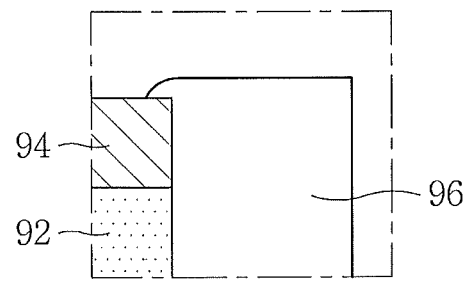

FIGS. 26 and 27 are cross-sectional views illustrating an intermediate structure provided in methods of forming a semiconductor packages according to some embodiments of the present inventive concept. FIGS. 28 and 29 are enlarged views of a portion of the semiconductor package illustrated in FIG. 27.

Referring to FIG. 26, the first semiconductor chip 21 may be mounted on the substrate 11. The second semiconductor chip 31 may be mounted on the first semiconductor chip 21. The TIM layer 92 may be formed on the first semiconductor chip 21 and may cover the second semiconductor chip 31. The heat spreader 94 may be formed on the TIM layer 92. The substrate 11 may include the plurality of external electrodes 13, the plurality of substrate lines 15, and the plurality of internal electrodes 17. The first semiconductor chip 21 may include the first active layer 22, the first rear surface layer 23, the plurality of first TSVs 25, the plurality of first lower electrodes 26, and the plurality of first upper electrodes 27. The plurality of first connection terminals 28 may be formed between the internal electrodes 17 of the substrate 11 and the first lower electrodes 26 of the first semiconductor chip 21.

The encapsulant 96 may be formed on the substrate 11 and may cover side surfaces of the first semiconductor chip 21, the TIM layer 92, and the heat spreader 94. The encapsulant 96 may include an epoxy molding compound (EMC). The encapsulant 96 may fill a space between the substrate 11 and the first semiconductor chip 21. Top surfaces of the heat spreader 94 may be exposed. The first connection terminals 28 may be formed through the encapsulant 96 and in contact with the internal electrodes 17 of the substrate 11 and the first lower electrodes 26 of the first semiconductor chip 21.

Referring to FIG. 27, the encapsulant 96 and the substrate 11 may be cut into an appropriate size using a trimming process or a sawing process. The external terminals 12 may be formed on the external electrodes 13.

Referring to FIG. 28, a top surface of the encapsulant 96 may be formed at a lower level than a top surface of the heat spreader 94.

Referring to FIG. 29, a top surface of the encapsulant 96 may be formed at a higher level than a top surface of the heat spreader 94.

Figure 30:
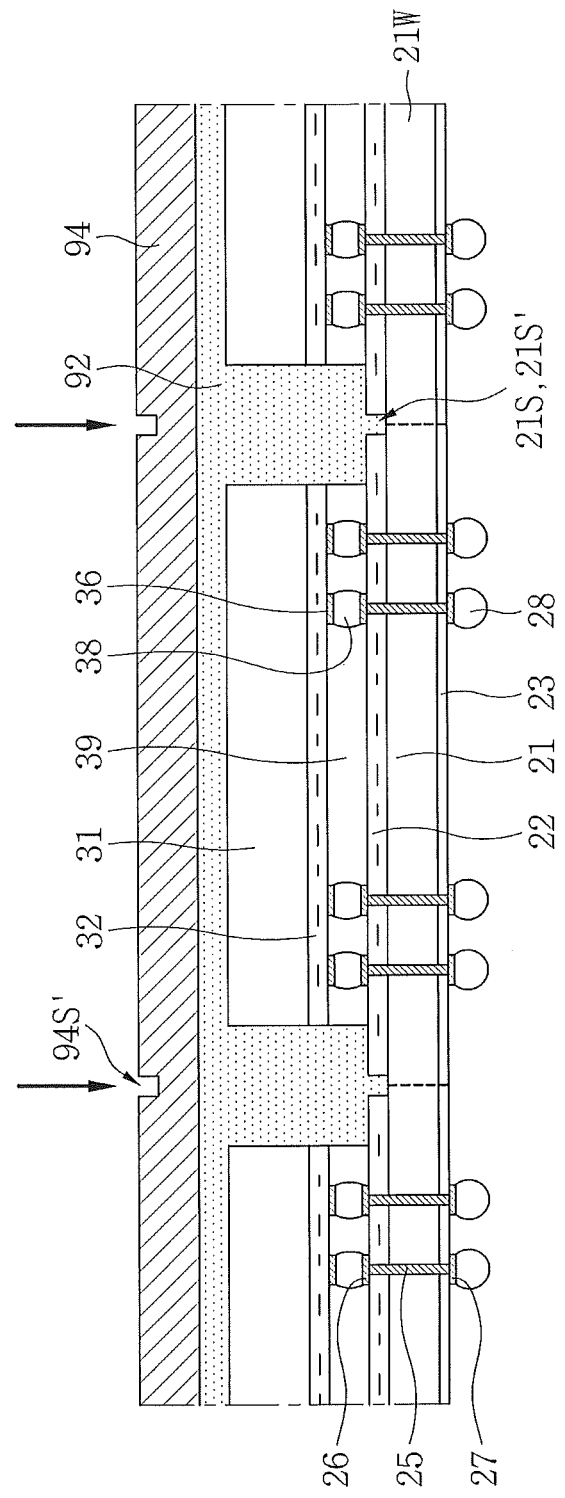
FIGS. 30, 31, and 33 are cross-sectional views illustrating an intermediate structure provided in methods of forming a semiconductor packages according to some embodiments of the present inventive concept.
Figure 31:
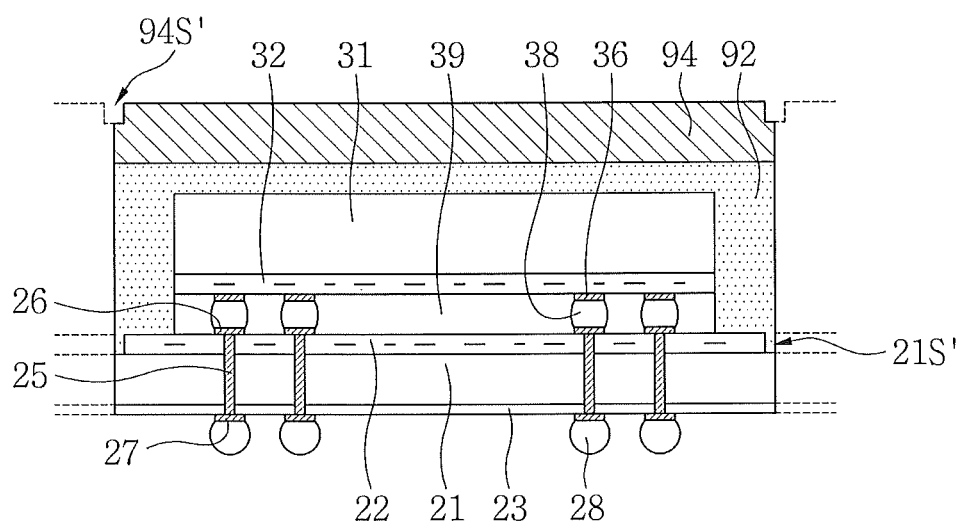
Figure 33:
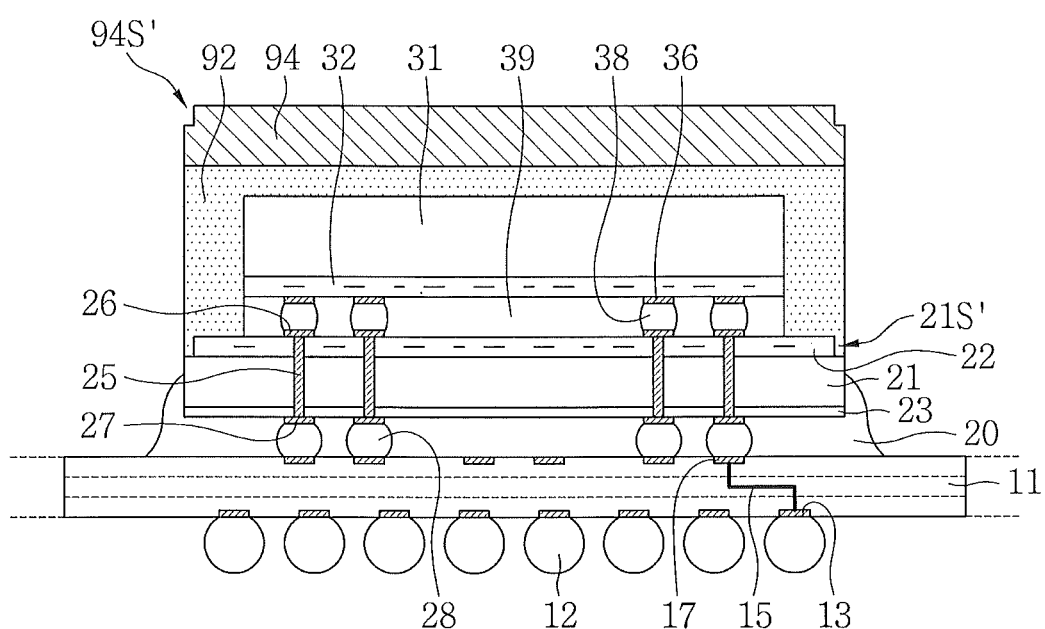

FIGS. 30, 31, and 33 are cross-sectional views illustrating an intermediate structure provided in methods of forming a semiconductor packages according to some embodiments of the present inventive concept.

Referring to FIGS. 30 and 31, the semiconductor wafer 21W may be provided. The semiconductor wafer 21W may include the plurality of first semiconductor chips 21. Each of the first semiconductor chips 21 may include the first active layer 22, the first scribe lanes 21S, the first rear surface layer 23, the plurality of first TSVs 25, the plurality of first lower electrodes 26, and the plurality of first upper electrodes 27. The first connection terminals 28 may be formed on the first upper electrodes 27. The first scribe lanes 21S and the first active layer 22 may be formed on a top surface of the semiconductor wafer 21W.

The second semiconductor chips 31 may be mounted on the first semiconductor chips 21. Each of the second semiconductor chips 31 may include the second active layer 32 and the plurality of second lower electrodes 36. The first adhesive layer 39 may be formed between the first active layer 22 and the second active layer 32. The second connection terminals 38 may be formed between the first lower electrodes 26 and the second lower electrodes 36 and may penetrate the first adhesive layer 39.

The TIM layer 92 may be formed on the semiconductor wafer 21W and may cover the second semiconductor chips 31. The TIM layer 92 may fill spaces between the second semiconductor chips 31 and may contact top surfaces of the second semiconductor chips 31. The TIM layer 92 may be in contact with the first active layer 22 of each of the first semiconductor chips 21. A heat spreader 94 may be formed on the TIM layer 92. The second scribe lanes 94S may be formed on a top surface of the heat spreader 94. The first rear surface layer 23 and the first connection terminals 28 may be exposed.

The semiconductor wafer 21W, the TIM layer 92, and the heat spreader 94 may be cut along the second scribe lanes 94S using a trimming process or a sawing process. Side surfaces of the first semiconductor chip 21, the TIM layer 92, and the heat spreader 94 may be exposed. The side surfaces of the first semiconductor chip 21, the TIM layer 92, and the heat spreader 94 may be aligned on a straight line or may be substantially coplanar with each other. The second scribe lanes 94S may partially remain on an edge portion of the heat spreader 94.

Figure 32:
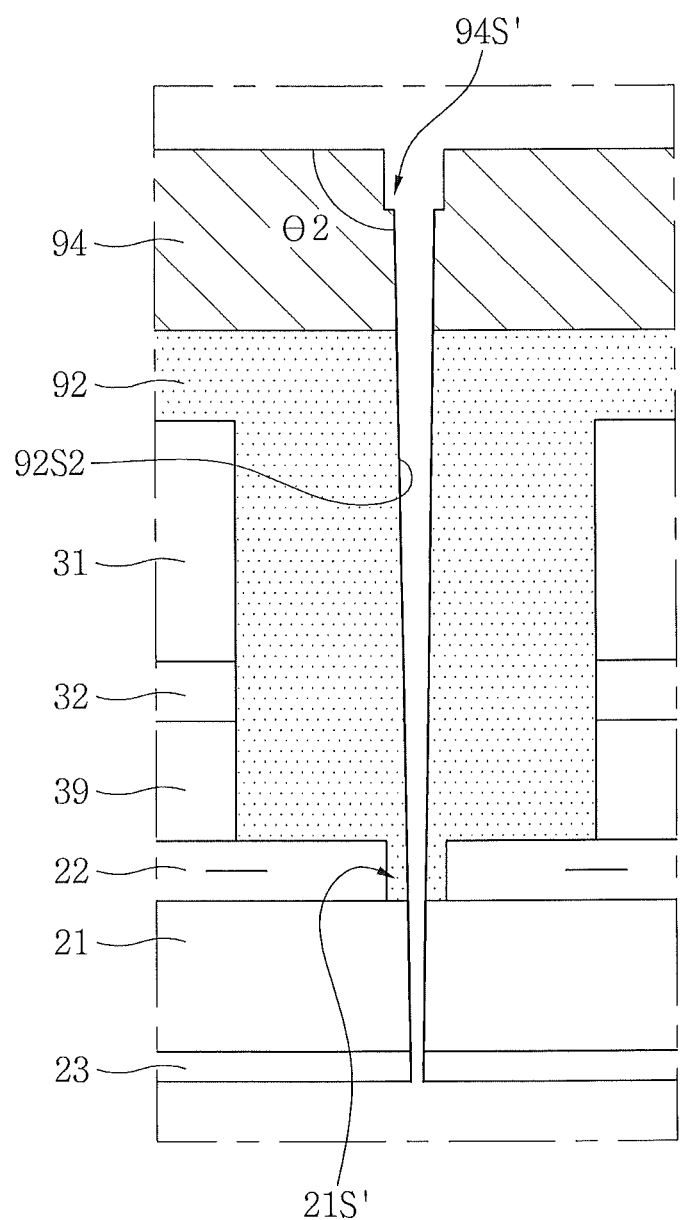
FIG. 32 is an enlarged view of a portion of the semiconductor package illustrated in FIG. 31.

FIG. 32 is a enlarged view of a portion of the semiconductor package illustrated in FIG. 31. Referring to FIG. 32, a second straight line 92S2 defined by the side surfaces of the first semiconductor chip 21, the TIM layer 92, and the heat spreader 94 may be inclined due to a cutting technique of a sawing process. An angle between a top surface of the heat spreader 94 and the second straight line 92S2 may be a second angle θ2. The second angle θ2 may be an obtuse angle.

Referring to FIG. 33, the first semiconductor chip 21 may be mounted on the substrate 11. The substrate 11 may include the plurality of external electrodes 13, the plurality of substrate lines 15, and the plurality of internal electrodes 17. The first connection terminals 28 may be in contact with the internal electrodes 17 of the substrate 11. The underfill layer 20 may be formed between the substrate 11 and the first semiconductor chip 21. The external terminals 12 may be formed on the external electrodes 13.

FIGS. 34 through 39 are cross-sectional views illustrating an intermediate structure provided in methods of forming a semiconductor packages according to some embodiments of the present inventive concept.

Figure 34:
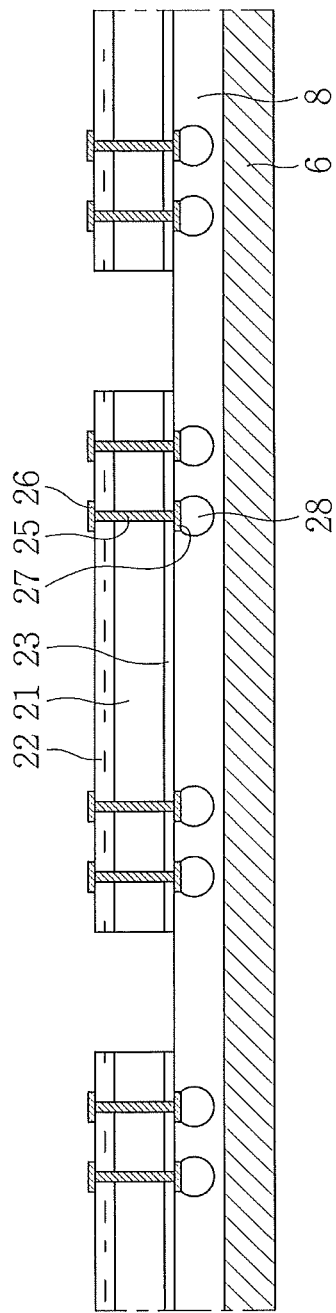
FIGS. 34 through 39 are cross-sectional views illustrating an intermediate structure provided in methods of forming a semiconductor packages according to some embodiments of the present inventive concept.

Referring to FIG. 34, a plurality of first semiconductor chips 21 may be mounted on the carrier 6 using the sacrificial adhesive layer 8. Each of the first semiconductor chips 21 may include the first active layer 22, the first rear surface layer 23, the plurality of first TSVs 25, the plurality of first lower electrodes 26, and the plurality of first upper electrodes 27. The first connection terminals 28 may be formed on the first upper electrodes 27. The sacrificial adhesive layer 8 may be in contact with the first rear surface layer 23 and the first connection terminals 28.

Figure 35:
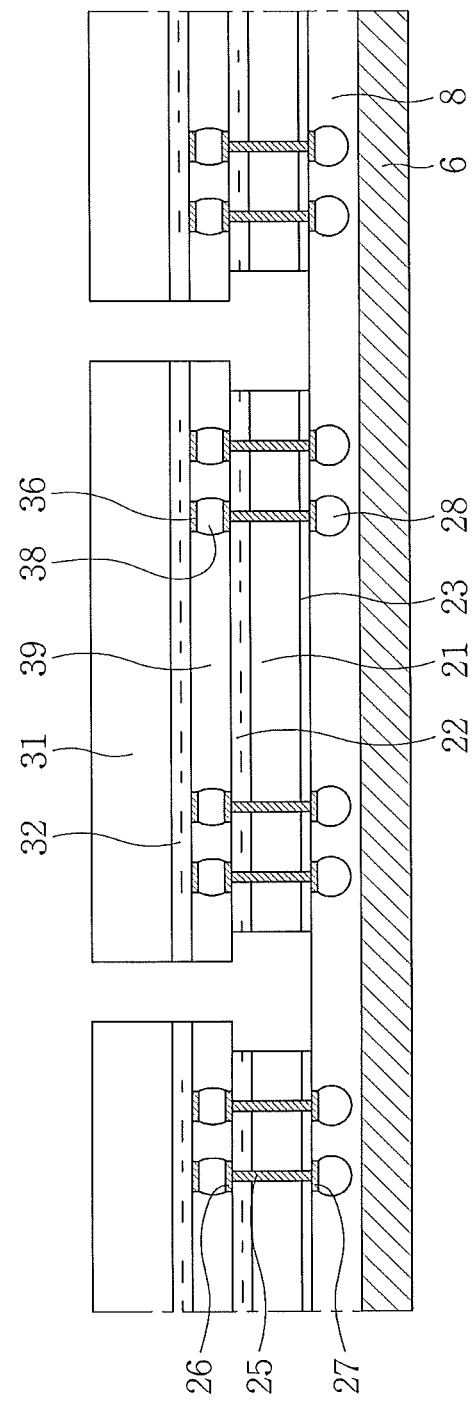

Referring to FIG. 35, the second semiconductor chips 31 may be respectively mounted on the first semiconductor chips 21. Each of the second semiconductor chips 31 may include the second active layer 32 and the plurality of second lower electrodes 36. The first adhesive layer 39 may be formed between the first rear surface layer 23 and the second active layer 32. The second connection terminals 38 may be formed between the first lower electrodes 26 and the second lower electrodes 36 and may penetrate the first adhesive layer 39. Each of the second semiconductor chips 31 may be of a different kind from the first semiconductor chip 21. Each of the second semiconductor chips 31 may have a different horizontal width and/or vertical thickness from a horizontal width and a vertical thickness of the first semiconductor chip 21. For instance, each of the second semiconductor chips 31 may have a greater horizontal width than the horizontal width of the first semiconductor chip 21.

Figure 36:
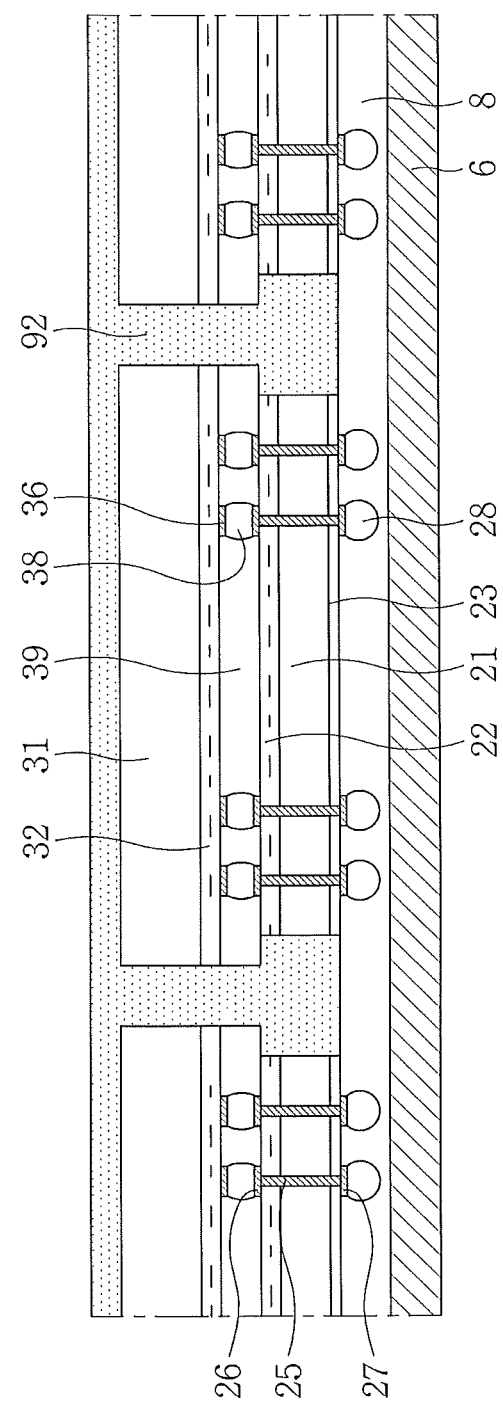

Referring to FIG. 36, the TIM layer 92 may be formed on the sacrificial adhesive layer 8 and may cover the first semiconductor chips 21 and the second semiconductor chips 31. The TIM layer 92 may be in contact with side surfaces of the first semiconductor chips 21 and the second semiconductor chips 31.

Figure 37:
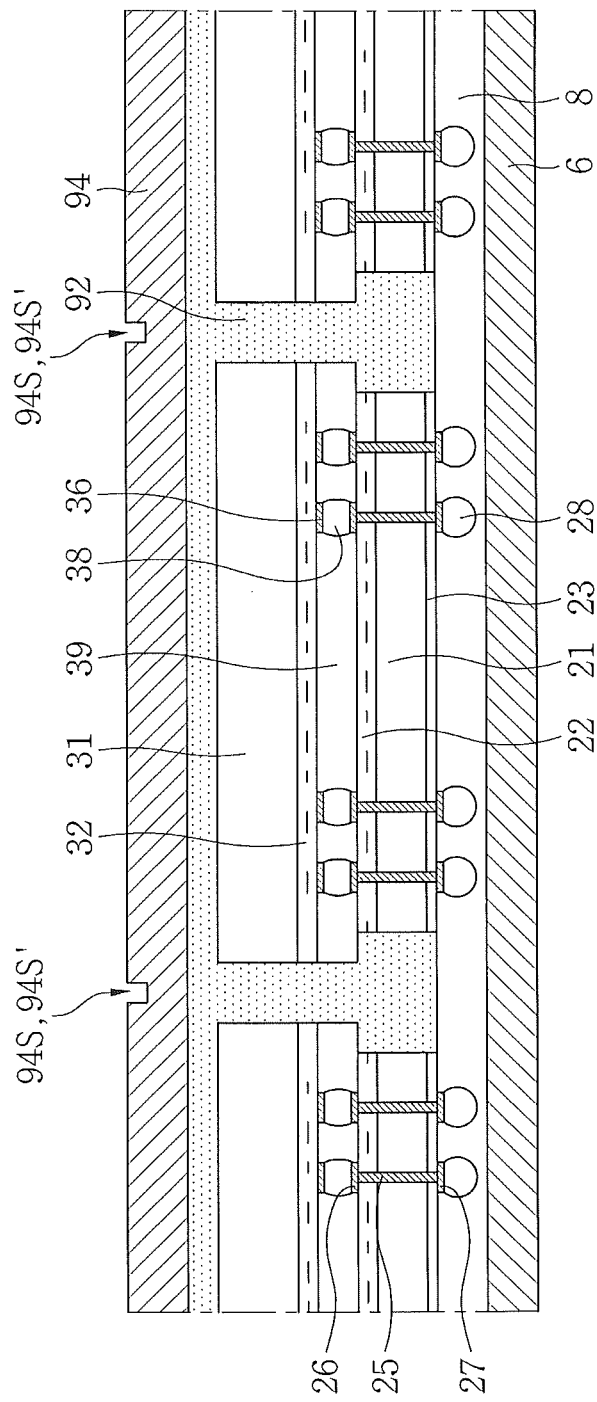

Referring to FIG. 37, the heat spreader 94 may be formed on the TIM layer 92. The second scribe lanes 94S may be formed on a top surface of the heat spreader 94.

Figure 38:
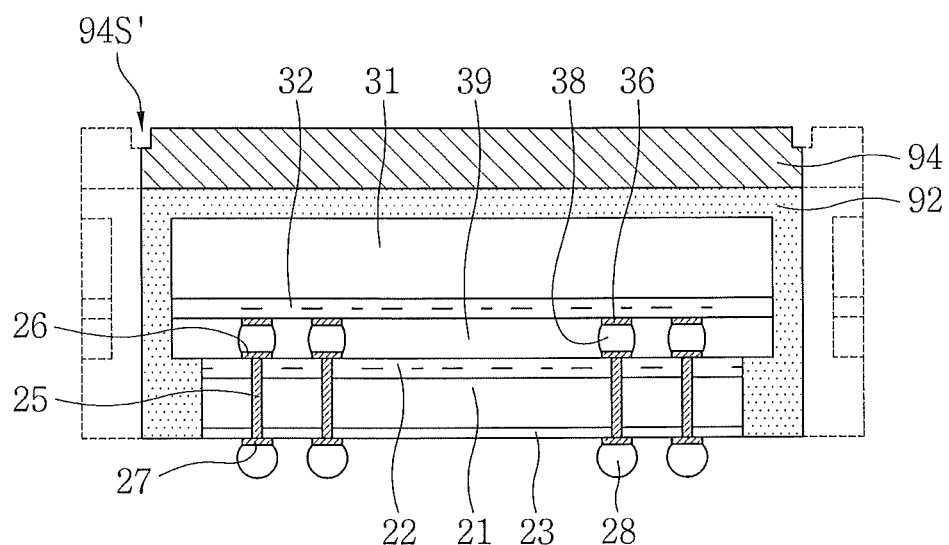

Referring to FIG. 38, the carrier 6 and the sacrificial adhesive layer 8 may be removed. The first rear surface layer 23 and the first connection terminals 28 may be exposed. The TIM layer 92 and the heat spreader 94 may be cut along the second scribe lanes 94S using a trimming process or a sawing process. Side surfaces of the TIM layer 92 and the heat spreader 94 may be exposed. The side surfaces of the TIM layer 92 and the heat spreader 94 may be aligned on a straight line or may be substantially coplanar with each other. Portions of the second scribe lanes 94S may remain on edge portions of the heat spreader 94 and the remaining portions of the second scribe lanes 94S may define the second recesses 94S'.

Figure 39:
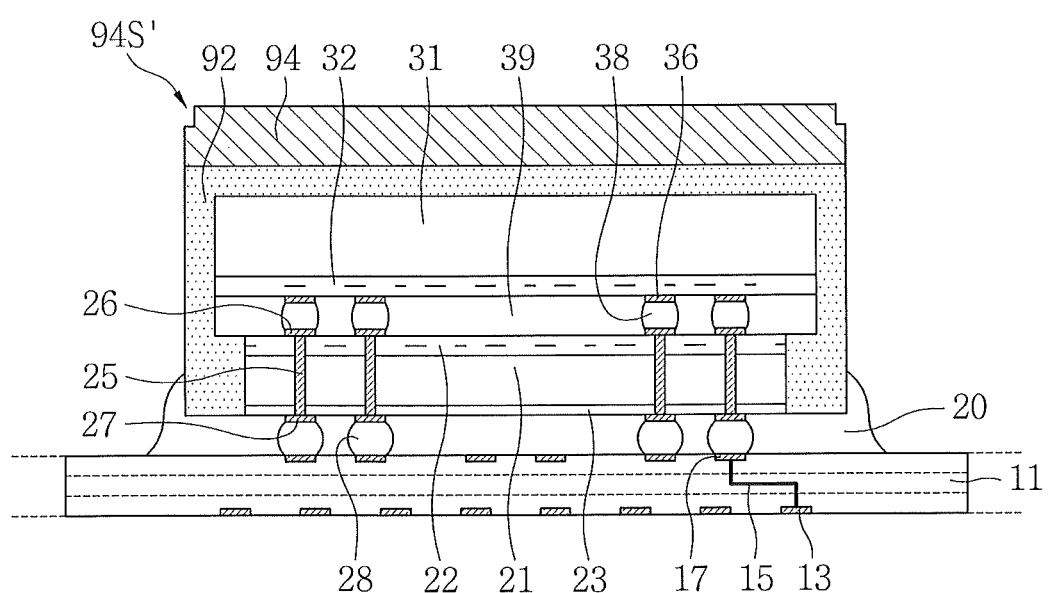

Referring to FIG. 39, the first semiconductor chip 21 may be mounted on the substrate 11. The substrate 11 may include the plurality of external electrodes 13, the plurality of substrate lines 15, and the plurality of internal electrodes 17. The first connection terminals 28 may be in contact with the internal electrodes 17 of the substrate 11. The underfill layer 20 may be formed between the substrate 11 and the first semiconductor chip 21. The underfill layer 20 may partially cover the side surfaces of the TIM layer 92. The external electrodes 12 may be formed on the external electrodes 13.

Figure 40:
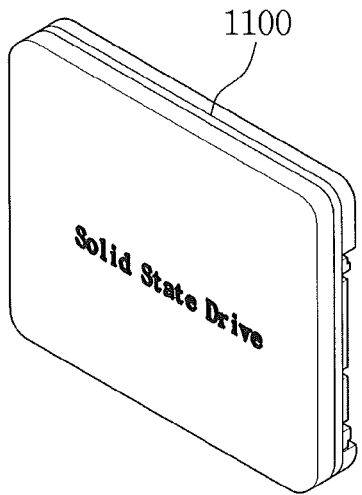
FIGS. 40 and 41 are a perspective view and a block diagram of an electronic device, respectively, according to some embodiments of the present inventive concept.
Figure 41:
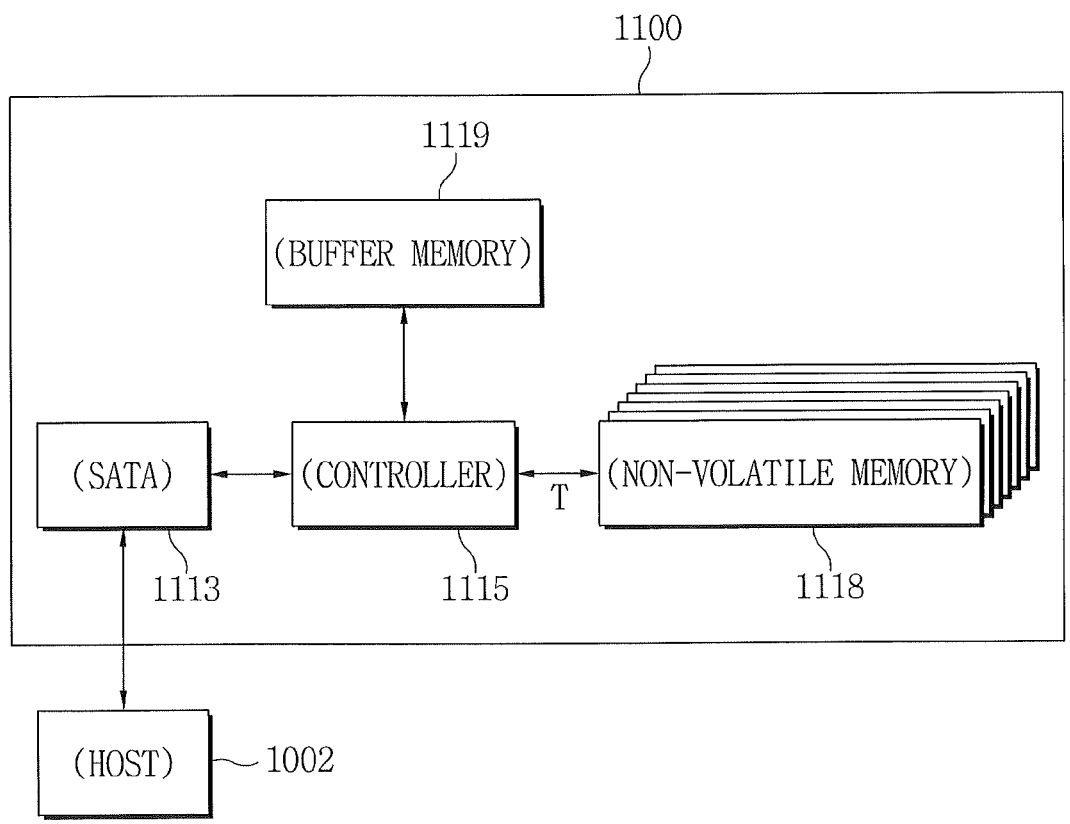

FIGS. 40 and 41 are a perspective view and a block diagram of an electronic device, respectively, according to some embodiments of the present inventive concept. Referring to FIGS. 40 and 41, the electronic device according to some embodiments of the present inventive concept may be a data storage device, such as a solid-state drive (SSD) 1100. The SSD 1100 may include an interface 1113 (for example, Serial Advanced Technology Attachment (SATA)), a controller 1115, a non-volatile memory 1118, and a buffer memory 1119. The SSD 1100 may be a device configured to store information using a semiconductor device. As compared with a hard disk drive (HDD), the SSD 1100 may operate at high speed and may operate with reduced mechanical delay, low failure rate, low generation of heat, and low noise. The SSD 1100 may be downscaled and may be made lightweight. The SSD 1100 may be applied to laptop personal computers (laptop PCs), desktop PCs, MP3 players, or portable storage devices.

The controller 1115 may be disposed adjacent the interface 1113 and may be electrically connected to the interface 1113. The controller 1115 may be an MP including a memory controller and a buffer controller. The non-volatile memory 1118 may be disposed adjacent the controller 1115 and may be electrically connected to the controller 1115. The SSD 1100 may have a data capacity corresponding to the non-volatile memory 1118. The buffer memory 1119 may be disposed adjacent the controller 1115 and may be electrically connected to the controller 1115.

The interface 1113 may be connected to a host 1002 and may transmit and receive electric signals, such as data. For example, the interface 1113 may be an apparatus using a standard, such as SATA, integrated drive electronics (IDE), small computer system interface (SCSI), and/or a combination thereof. The non-volatile memory 1118 may be connected to the interface 1113 via the controller 1115. The non-volatile memory 1118 may store data received through the interface 1113. Even if power supplied to the SSD 1100 is interrupted, the non-volatile memory 1118 may retain the stored data.

The buffer memory 1119 may include a volatile memory device. The volatile memory device may be a DRAM and/or a static random access memory (SRAM). The buffer memory 1119 may operate at higher speed than the non-volatile memory 1118.

Data processing speed of the interface 1113 may be higher than an operation speed of the non-volatile memory 1118. Here, the buffer memory 1119 may temporarily store data. After data received through the interface 1113 is temporarily stored in the buffer memory 1119 through the controller 1115, the received data may be permanently stored in the non-volatile memory 1118 at a data write speed of the non-volatile memory 1118. Also, among the data stored in the non-volatile memory 1118, frequently used data may be previously read and temporarily stored in the buffer memory 1119. That is, the buffer memory 1119 may increase an effective operating speed of the SSD 1100 and may reduce error rate.

At least one of the non-volatile memory 1118, the buffer memory 1119, and the controller 1115 may have semiconductor packages according to some embodiments of the present inventive concept.

Figure 42:
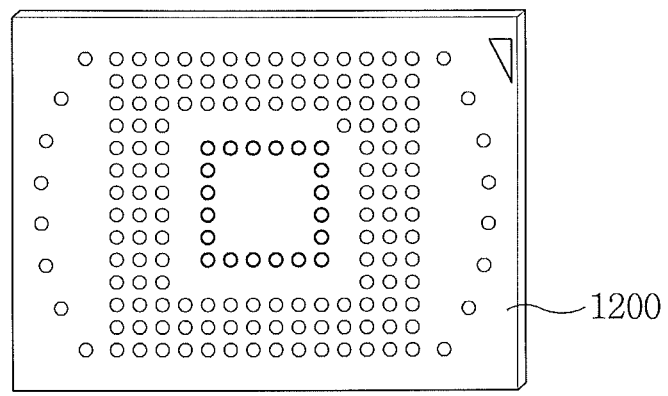
FIGS. 42 through 44 are perspective views of electronic systems according to some embodiments of the present inventive concept.
Figure 43:
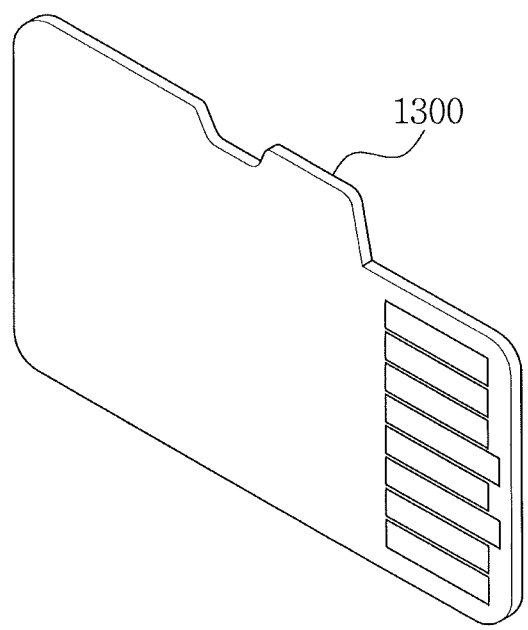
Figure 44:
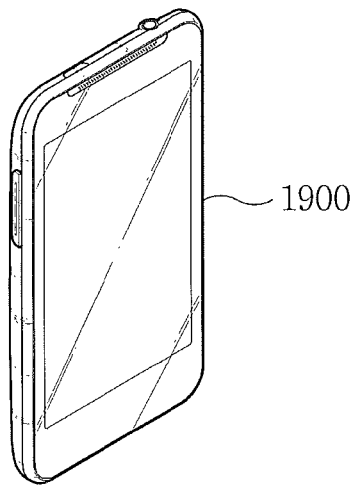

FIGS. 42 through 44 are perspective views of electronic systems according to some embodiments of the present inventive concept. Referring to FIGS. 42 through 44, semiconductor packages according to some embodiments of the present inventive concept may be applied to electronic systems, such as an embedded multi-media chip (eMMC) 1200, a micro-secure digital (micro SD) 1300, a smart phone 1900, a netbook, a laptop computer, or a tablet PC. For instance, the semiconductor packages may be mounted on a main-board of the smart phone 1900. Alternatively, the semiconductor packages may be included in an expansion device, such as the micro SD 1300, and may be operated with the smart phone 1900.

Figure 45:
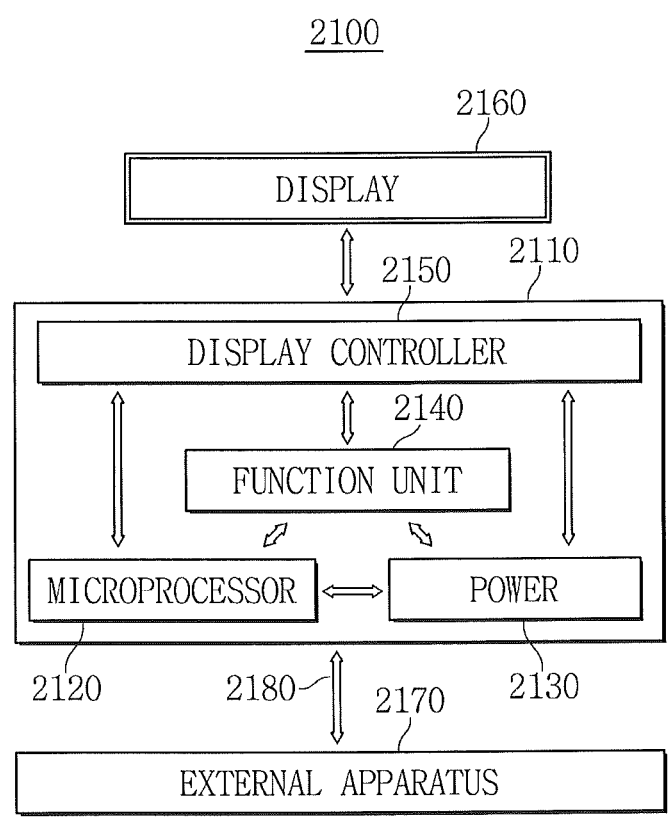
FIG. 45 is a block diagram of an electronic system according to some embodiments of the present inventive concept.

FIG. 45 is a block diagram of an electronic system according to some embodiments of the present inventive concept. Referring to FIG. 45, semiconductor packages according to some embodiments of the present inventive concept may be applied to an electronic system 2100. The electronic system 2100 may include a body 2110, a microprocessor (MP) 2120, a power unit 2130, a function unit 2140, and/or a display controller 2150. The body 2110 may be a motherboard having a PCB. The MP 2120, the power unit 2130, the function unit 2140, and the display controller 2150 may be mounted on the body 2110. A display 2160 may be disposed on a top surface of the body 2110 or outside the body 2110. For example, the display 2160 may be disposed on a surface of the body 2110 and may display an image processed by the display controller 2150.

The power unit 2130 may receive a predetermined voltage from an external power source, divide the predetermined voltage into various voltage levels, and transmit those voltages to the MP 2120, the function unit 2140, and the display controller 2150. The MP 2120 may receive a voltage from the power unit 2130 and control the function unit 2140 and the display 2160. The function unit 2140 may implement various functions of the electronic system 2100. For instance, when the electronic system 2100 is a mobile electronic product, such as a portable phone, the function unit 2140 may include several elements capable of wireless communication functions, such as output of an image to the display 2160 or output of a voice to a speaker, by dialing or communication with an external device 2170. When the function unit 2140 includes a camera, the function unit 2140 may serve as an image processor.

In some embodiments, when the electronic system 2100 is connected to a memory card to increase capacity, the function unit 2140 may be a memory card controller. The function unit 2140 may exchange signals with the external device 2170 through a wired or wireless communication unit 2180. In addition, when the electronic system 2100 needs a universal serial bus (USB) to expand functions thereof, the function unit 2140 may serve as an interface controller. The function unit 2140 may include a mass storage device. Semiconductor packages according to some embodiments may be applied to the function unit 2140 or the MP 2120.

According to some embodiments of the present inventive concept, a TIM layer may be formed on a first semiconductor chip and may be in contact with side surfaces of a second semiconductor chip. A heat spreader may be formed on the second semiconductor chip and the TIM layer. Side surfaces of the first semiconductor chip, the TIM layer, and the heat spreader may be exposed. The side surfaces of the first semiconductor chip, the TIM layer, and the heat spreader may be aligned on a straight line or may be substantially coplanar with each other. Accordingly, a semiconductor package capable of ensuring mechanical reliability and improving heat radiation characteristics can be formed.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising:
   a first semiconductor chip comprising a plurality of through-silicon vias (TSVs);
   a plurality of connection terminals on a first surface of the first semiconductor chip and respectively connected to the plurality of TSVs;
   a second semiconductor chip on a second surface of the first semiconductor chip;
   a thermal interface material (TIM) layer on the first semiconductor chip and in contact with side surfaces of the second semiconductor chip;
   a heat spreader on the second semiconductor chip and the TIM layer;
   a substrate on the first surface of the first semiconductor chip such that the first semiconductor chip is disposed between the second semiconductor chip and the substrate; and
   an underfill layer between the first semiconductor chip and the substrate,
   wherein side surfaces of the first semiconductor chip, the TIM layer, and the heat spreader are substantially coplanar with each other,
   wherein an edge portion of the first surface of the first semiconductor chip comprises a recess defined by a portion of a scribe lane,
   wherein the side surface of the first semiconductor chip terminates at the recess, and
   wherein the underfill layer only partially extends on the side surface of the first semiconductor chip.

2. The semiconductor package of claim 1, wherein:
   the second semiconductor chip has a horizontal width smaller than a horizontal width of the first semiconductor chip; and
   the TIM layer covers an upper surface and the side surfaces of the second semiconductor chip.

3. The semiconductor package of claim 1, wherein the heat spreader is in direct contact with the second semiconductor chip.

4. The semiconductor package of claim 1, wherein:
   the first surface of the first semiconductor chip extends in a first direction and the side surface of the first semiconductor chip extends in a second direction; and
   an angle between the first direction and the second direction is an obtuse angle.

5. The semiconductor package of claim 1, wherein:
   the recess comprises a first recess, and the scribe lane comprises a first scribe lane;
   an edge portion of a first surface of the heat spreader comprises a second recess defined by a portion of a second scribe lane; and
   the side surface of the heat spreader terminates at the second recess.

6. The semiconductor package of claim 5, wherein:
   the first surface of the heat spreader extends in a first direction and the side surface of the heat spreader extends in a second direction; and
   an angle between the first direction and the second direction is an obtuse angle.

7. The semiconductor package of claim 1, wherein the substrate is connected to the plurality of connection terminals.

8. The semiconductor package of claim 7,
   wherein the plurality of connection terminals pass through the underfill layer and are connected to the TSVs and the substrate.

9. The semiconductor package of claim 7, further comprising an encapsulant on the substrate covering the side surfaces of the first semiconductor chip, the TIM layer, and the heat spreader.

10. The semiconductor package of claim 9, wherein:
the encapsulant extends between the first semiconductor chip and the substrate; and
the plurality of connection terminals pass through the encapsulant and are connected to the TSVs and the substrate.

11. A semiconductor package comprising:
a first semiconductor chip;
a second semiconductor chip on the first semiconductor chip, wherein the first and second semiconductor chips are electrically connected to each other;
a heat spreader on the second semiconductor chip such that the second semiconductor chip is between the first semiconductor chip and the heat spreader;
a thermal interface material (TIM) layer surrounding the second semiconductor chip and directly contacting a sidewall of the second semiconductor chip, the TIM layer comprising aluminum oxide and/or zinc oxide;
a substrate under the first semiconductor chip such that the first semiconductor chip is disposed between the second semiconductor chin and the substrate; and
an underfill layer between the first semiconductor chip and the substrate, wherein the underfill layer only partially extends on a sidewall of the first semiconductor chip,
wherein an upper surface of the TIM layer directly contacts a lower surface of the heat spreader, and a sidewall of the TIM layer is substantially coplanar with a sidewall of the heat spreader,
wherein the heat spreader comprises an upper surface opposite the lower surface, and
wherein an edge portion of the upper surface of the heat spreader comprises a recess defined by a portion of a scribe lane.

12. The semiconductor package of claim 11, wherein:
the first semiconductor chip has a first width greater than a second width of the second semiconductor chip when viewed in cross section; and
the sidewall of the first semiconductor chip is substantially coplanar with the sidewall of the TIM layer.

13. The semiconductor package of claim 12, wherein:
the recess comprises a first recess, and the scribe lane comprises a first scribe lane;
the first semiconductor chip comprises a first surface facing the second semiconductor chip and a second surface opposite the first surface; and
an edge portion of the second surface of the first semiconductor chip comprises a second recess defined by a portion of a second scribe lane.

14. The semiconductor package of claim 11, wherein an upper surface of the second semiconductor chip directly contacts the lower surface of the heat spreader.

15. A semiconductor package comprising:
a first semiconductor chip comprising a plurality of through-silicon vias (TSVs);
a plurality of connection terminals on a first surface of the first semiconductor chip and respectively connected to the plurality of TSVs;
a second semiconductor chip on a second surface of the first semiconductor chip;
a thermal interface material (TIM) layer on the first semiconductor chip and in contact with side surfaces of the second semiconductor chip;
a heat spreader on the second semiconductor chip and the TIM layer, wherein side surfaces of the first semiconductor chip, the TIM layer, and the heat spreader are substantially coplanar with each other;
a substrate under the first semiconductor chip such that the first semiconductor chip is disposed between the second semiconductor chip and the substrate, wherein the substrate is connected to the plurality of connection terminals;
an underfill layer between the first semiconductor chip and the substrate, wherein the plurality of connection terminals pass through the underfill layer and are connected to the TSVs and the substrate,
wherein the underfill layer only partially extends on the side surface of the first semiconductor chip.

16. The semiconductor package of claim 15, wherein the TIM layer comprises aluminum oxide and/or zinc oxide.

17. The semiconductor package of claim 15, wherein:
the second semiconductor chip has a horizontal width smaller than a horizontal width of the first semiconductor chip; and
the TIM layer covers an upper surface and the side surfaces of the second semiconductor chip.

18. The semiconductor package of claim 15, wherein the heat spreader is in direct contact with the second semiconductor chip.

19. The semiconductor package of claim 15, further comprising an encapsulant on the substrate covering the side surfaces of the first semiconductor chip, the TIM layer, and the heat spreader.

20. The semiconductor package of claim 19, wherein:
the encapsulant extends between the first semiconductor chip and the substrate; and
the plurality of connection terminals pass through the encapsulant and are connected to the TSVs and the substrate.

* * * * *